US007575294B2

(12) United States Patent
Imanaka et al.

(10) Patent No.: US 7,575,294 B2
(45) Date of Patent: Aug. 18, 2009

(54) PRINTHEAD SUBSTRATE, PRINTHEAD USING THE SUBSTRATE, HEAD CARTRIDGE INCLUDING THE PRINTHEAD, METHOD OF DRIVING THE PRINTHEAD, AND PRINTING APPARATUS USING THE PRINTHEAD

(75) Inventors: Yoshiyuki Imanaka, Kanagawa (JP); Teruo Ozaki, Kanagawa (JP); Takuya Hatsui, Tokyo (JP); Takaaki Yamaguchi, Kanagawa (JP); Ichiro Saito, Kanagawa (JP); Muga Mochizuki, Kanagawa (JP); Toshiyasu Sakai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 244 days.

(21) Appl. No.: 11/690,561

(22) Filed: Mar. 23, 2007

(65) Prior Publication Data

US 2007/0188559 A1 Aug. 16, 2007

Related U.S. Application Data

(62) Division of application No. 10/980,300, filed on Nov. 4, 2004, now Pat. No. 7,216,960.

(30) Foreign Application Priority Data

Nov. 6, 2003 (JP) ............................ 2003-377258
Nov. 6, 2003 (JP) ............................ 2003-377262

(51) Int. Cl.
*B41J 29/38* (2006.01)
*H01L 27/105* (2006.01)

(52) U.S. Cl. ........................... 347/12; 347/59; 257/204

(58) Field of Classification Search .................. 347/12, 347/56–59, 145, 180–182; 257/202, 204, 257/206; 400/120.05, 120.06
See application file for complete search history.

(56) References Cited

U.S. PATENT DOCUMENTS 4,313,124 A 1/1982 Hara (Continued)

FOREIGN PATENT DOCUMENTS

EP 0 737 586 10/1996

(Continued)

OTHER PUBLICATIONS

Patent Abstracts of Japan, vol. 2000, No. 24, May 11, 2001 (JP 2001-191531, Jul. 17, 2001).

(Continued)

*Primary Examiner*—Juanita D Stephens
(74) *Attorney, Agent, or Firm*—Fitzpatrick, Cella, Harper & Scinto

(57) ABSTRACT

This invention relates to a printhead substrate capable of suppressing an increase in wiring width and an increase in the size of a substrate formed by a film forming process while increasing the number of simultaneously driven printing elements in order to improve the printing performance, a printhead using the substrate, and a printing apparatus using the printhead. The wiring lines of the substrate are formed into a common wiring line, and energy applied to a heating resistance element is prevented from deviating from a stable ink discharge range owing to the difference in the number of simultaneously driven heating resistance elements. For this purpose, a driving element is greatly downsized in comparison with a conventional one, and the operation region of a MOS transistor is shifted from the non-saturation region to the saturation region.

14 Claims, 32 Drawing Sheets

COMMON WIRING LAYOUT + DOWNSIZING OF OVERALL HEATER DRIVING ELEMENT PART

U.S. PATENT DOCUMENTS

| | | | |
|---|---|---|---|
| 4,345,262 | A | 8/1982 | Shirato et al. |
| 4,429,321 | A | 1/1984 | Matsumoto |
| 4,459,600 | A | 7/1984 | Sato et al. |
| 4,463,359 | A | 7/1984 | Ayata et al. |
| 4,558,333 | A | 12/1985 | Sugitani et al. |
| 4,709,243 | A | 11/1987 | Kato et al. |
| 4,723,129 | A | 2/1988 | Endo et al. |
| 4,740,796 | A | 4/1988 | Endo et al. |
| 5,767,872 | A | 6/1998 | Scardovi et al. |
| 5,809,214 | A | 9/1998 | Nureki et al. |
| 5,841,448 | A | 11/1998 | Moriyama et al. |
| 5,943,070 | A | 8/1999 | Kamiyama et al. |
| 6,003,973 | A | 12/1999 | Kamiyama et al. |
| 6,054,689 | A | 4/2000 | Imanaka et al. |
| 6,074,041 | A | 6/2000 | Imanaka et al. |
| 6,097,208 | A | 8/2000 | Okajima et al. |
| 6,116,714 | A | 9/2000 | Imanaka et al. |
| 6,130,692 | A | 10/2000 | Mochizuki et al. |
| 6,224,184 | B1 | 5/2001 | Imanaka et al. |
| 6,224,195 | B1 | 5/2001 | Maru et al. |
| 6,252,616 | B1 | 6/2001 | Okazaki et al. |
| 6,293,655 | B1 | 9/2001 | Imanaka et al. |
| 6,302,504 | B1 | 10/2001 | Imanaka et al. |
| 6,315,853 | B1 | 11/2001 | Kubota et al. |
| 6,382,756 | B1 | 5/2002 | Komuro |
| 6,402,302 | B1 | 6/2002 | Ozaki et al. |
| 6,439,680 | B1 | 8/2002 | Mochizuki et al. |
| 6,443,563 | B1 | 9/2002 | Saito et al. |
| 6,450,617 | B1 | 9/2002 | Kitani et al. |
| 6,454,379 | B1 | 9/2002 | Taneya et al. |
| 6,467,863 | B1 | 10/2002 | Imanaka et al. |
| 6,474,769 | B1 | 11/2002 | Imanaka et al. |
| 6,513,911 | B1 | 2/2003 | Ozaki et al. |
| 6,520,613 | B1 | 2/2003 | Tamura |
| 6,523,922 | B2 | 2/2003 | Hirayama |
| 6,540,316 | B1 | 4/2003 | Imanaka et al. |
| 6,578,951 | B2 | 6/2003 | Ozaki et al. |
| 6,609,783 | B1 | 8/2003 | Koyama et al. |
| 6,653,748 | B2 * | 11/2003 | Buchanan .................... 307/51 |
| 6,688,729 | B1 | 2/2004 | Imanaka et al. |
| 6,712,437 | B2 | 3/2004 | Furukawa et al. |
| 6,773,096 | B2 | 8/2004 | Mochizuki et al. |
| 6,824,237 | B2 | 11/2004 | Hirayama et al. |
| 6,890,048 | B2 * | 5/2005 | Hirayama .................... 347/12 |
| 2002/0036781 | A1 | 3/2002 | Hirayama |
| 2003/0090533 | A1 | 5/2003 | Imanaka et al. |
| 2003/0142153 | A1 | 7/2003 | Nakajima et al. |
| 2004/0012654 | A1 | 1/2004 | Takeuchi et al. |
| 2005/0134620 | A1 | 6/2005 | Hirayama et al. |
| 2005/0140707 | A1 | 6/2005 | Imanaka et al. |

FOREIGN PATENT DOCUMENTS

| | | |
|---|---|---|
| EP | 0 816 082 | 1/1998 |
| JP | 54-51837 | 4/1979 |
| JP | 56-89578 | 7/1981 |
| JP | 59-95154 | 6/1984 |
| JP | 3-208654 | 9/1991 |
| JP | 9-226102 | 9/1997 |
| JP | 9-300620 | 11/1997 |
| JP | 10-105306 | 4/1998 |
| JP | 2001-277516 | 10/2001 |
| KR | 10-0238857 | 1/2000 |
| KR | 10-0398032 | 3/2004 |

OTHER PUBLICATIONS

Patent Abstracts of Japan, vol. 1998, No. 10, Aug. 31, 1998 (JP 10-138484, May 26, 1998).

* cited by examiner

COMMON WIRING LAYOUT + DOWNSIZING OF OVERALL HEATER DRIVING ELEMENT PART

ENERGY (E) AT HEATING RESISTANCE ELEMENT = $I^2R = V^2/R$

I : CURRENT OF HEATING RESISTANCE ELEMENT
V : VOLTAGE BETWEEN BOTH ENDS OF HEATING RESISTANCE ELEMENT
R : RESISTANCE VALUE OF HEATING RESISTANCE ELEMENT

FIG. 19

LOSSES OTHER THAN THOSE OF PRINTING ELEMENT AND DRIVER ARE CONTAINED IN 1 V OF DRIVER LOSS AND THE LIKE.

| PRINTING ELEMENT RESISTANCE | VOLTAGE BETWEEN BOTH ENDS OF PRINTING ELEMENT | CURRENT FOR CONSTANT VOLTAGE BETWEEN BOTH ENDS OF PRINTING ELEMENT | POWER APPLIED TO PRINTING ELEMENT UNDER CONDITIONS DESCRIBED LEFT | POWER LOSS FOR 16 V POWER SUPPLY | POWER LOSS RATIO (TO POWER APPLIED TO PRINTING ELEMENT) | PULSE WIDTH $P_W$ FOR CONSTANT ENERGY | ENERGY APPLIED TO PRINTING ELEMENT | ENERGY LOSS | MAXIMUM DRIVING $F_{OP}$ IN 32 DIVISION |
|---|---|---|---|---|---|---|---|---|---|
| Ω | V | A | W | W | | μS | μJ | μJ | |
| 80 | 15.0 | 0.188 | 2.813 | 0.188 | 0.067 | 0.80 | 2.25 | 0.150 | 39.1KHz |
| 90 | 15.0 | 0.167 | 2.500 | 0.167 | 0.067 | 0.90 | 2.25 | 0.150 | 34.7KHz |
| 100 | 15.0 | 0.150 | 2.250 | 0.150 | 0.067 | 1.00 | 2.25 | 0.150 | 31.3KHz |
| 110 | 15.0 | 0.136 | 2.045 | 0.136 | 0.067 | 1.10 | 2.25 | 0.150 | 28.4KHz |
| 120 | 15.0 | 0.125 | 1.875 | 0.125 | 0.067 | 1.20 | 2.25 | 0.150 | 26.0KHz |

REPRESENTING DIFFERENCE IN MAXIMUM DRIVING DISCHARGE FREQUENCY OBTAINED FROM TIME WHEN PULSE WIDTH IS MULTIPLIED 32 TIMES (IN 32 TIME DIVISION) OWING TO VARIATIONS IN RESISTANCE VALUE OF PRINTING ELEMENT

FIG. 30

LOSSES OTHER THAN THOSE OF PRINTING ELEMENT AND DRIVER ARE CONTAINED IN 1 V OF DRIVER LOSS.

| PRINTING ELEMENT RESISTANCE | VOLTAGE BETWEEN BOTH ENDS OF PRINTING ELEMENT FOR CONSTANT CURRENT | POWER $V^2/R$ APPLIED TO PRINTING ELEMENT FOR CONSTANT CURRENT | POWER LOSS FOR 19 V POWER SUPPLY | POWER LOSS RATIO | PULSE WIDTH $P_W$ FOR CONSTANT ENERGY | ENERGY APPLIED TO PRINTING ELEMENT | ENERGY LOSS |
|---|---|---|---|---|---|---|---|
| Ω | V | W | W | | µS | µJ | µJ |
| 80 | 12.0 | 1.800 | 1.05 | 0.583 | 1.25 | 2.25 | 1.31 |
| 90 | 13.5 | 2.025 | 0.825 | 0.407 | 1.11 | 2.25 | 0.92 |
| 100 | 15.0 | 2.250 | 0.6 | 0.267 | 1.00 | 2.25 | 0.60 |
| 110 | 16.5 | 2.475 | 0.375 | 0.152 | 0.91 | 2.25 | 0.34 |
| 120 | 18.0 | 2.700 | 0.15 | 0.056 | 0.83 | 2.25 | 0.13 |

3001

3002

3003

PRINTHEAD SUBSTRATE, PRINTHEAD USING THE SUBSTRATE, HEAD CARTRIDGE INCLUDING THE PRINTHEAD, METHOD OF DRIVING THE PRINTHEAD, AND PRINTING APPARATUS USING THE PRINTHEAD

This is a divisional application of application Ser. No. 10/980,300, filed Nov. 4, 2004, now U.S. Pat. No. 7,216,960, issued May 15, 2007.

FIELD OF THE INVENTION

This invention relates to a printhead substrate, a printhead using the substrate, a head cartridge including the printhead, a method of driving the printhead, and a printing apparatus using the printhead and, more particularly, to a printhead substrate for a printhead complying with an inkjet method of printing an image or the like by discharging ink onto a printing medium, a printhead using the substrate, a head cartridge including the printhead, a method of driving the printhead, and a printing apparatus using the printhead

BACKGROUND OF THE INVENTION

A printing apparatus having the function of a printer, copying machine, facsimile apparatus, or the like, or a printing apparatus used as an output device for a multifunction apparatus or workstation including a computer, word processor, or the like prints an image on a printing medium such as a printing sheet or thin plastic plate (used for an OHP sheet or the like) on the basis of image information.

Such printing apparatuses are classified by the printing method used into an inkjet type, wire dot type, thermal type, thermal transfer type, electrophotographic type, and the like.

Of these printing apparatuses, a printing apparatus of an inkjet type (to be referred to as an inkjet printing apparatus hereinafter) prints by discharging ink from a printhead onto a printing medium. The inkjet printing apparatus has many advantages: the apparatus can be easily downsized, print a high-resolution image at a high speed, and print on a plain sheet without requiring any special process. In addition, the running cost of the inkjet printing apparatus is low, and the inkjet printing apparatus hardly generates noise because of non-impact printing and can print a color image by using multicolor ink.

The inkjet printing method includes several methods, and one of the methods is a bubble-jet printing method in which a heater is mounted within a nozzle, bubbles are generated in ink by heat, and the foaming energy is used to discharge ink. A printing element which generates thermal energy for discharging ink can be manufactured by a semiconductor manufacturing process. Examples of a commercially available printhead utilizing the bubble-jet technique are (1) a printhead obtained by forming a printing element on a silicon substrate as a base to prepare a printing element substrate and joining to the printing element substrate a top plate which has a groove for forming an ink channel and is made of a resin (e.g., polysulfone), glass, or the like, and (2) a high-resolution printhead obtained by directly forming a nozzle on an element substrate by photolithography so as to eliminate any joint.

Since the element substrate is made of a silicon substrate, not only a printing element is formed on an element substrate, but a driver for driving the printing element, a temperature sensor used to control the printing element in accordance with the temperature of the printhead, a driving controller for the driver, and the like may be formed on the element substrate.

The bubble-jet printing method differs from other inkjet printing methods in that a liquid which receives thermal energy is heated to generate bubbles, droplets are discharged from an orifice at the distal end of the printhead by an operating force based on generation of bubbles, and the droplets are attached to a printing medium to print information (see, e.g., Japanese Patent Publication Laid-Open No. 54-51837).

An inkjet printhead (to be referred to as a printhead hereinafter) according to the printing method using thermal energy generally comprises: a liquid discharge portion having an orifice formed to discharge liquid and a liquid channel which communicates with the orifice and is a part of a heat acting portion for causing thermal energy to act on the liquid so as to discharge droplets; a heating resistance element serving as an electrothermal transducer which is means for generating thermal energy; an upper protective layer which protects the heating resistance element from ink; and a lower layer which accumulates heat.

Such printhead requires many heating resistance elements for higher density and higher speed printing in order to exploit the features of the printhead. As the number of heating resistance elements increases, the number of electrical connections with an external wiring board increases. When heating resistance elements are arrayed at a high density, the pitch between the electrode pads of the heating resistance elements decreases, and the heating resistance elements cannot be connected by a traditional electrical connection method (wire bonding or the like).

Conventionally, this problem is solved by building driving elements for heating resistance elements in a substrate (see, e.g., U.S. Pat. No. 4,429,321). There has also conventionally been proposed a printhead which vertically discharges ink from a heat acting portion by adhering and forming an orifice plate having ink orifices onto a substrate (see, e.g., Japanese Patent Publication Laid-Open No. 59-95154).

In order to improve the removability of ink which stays on the orifice plate, and form a plurality of ink supply ports in a single substrate so as to discharge a plurality of types of inks by one substrate, such printhead is connected outside the substrate by arranging electrode pads along peripheral sides of a substrate which are parallel to short sides of the long-groove-like ink supply ports.

This configuration readily increases the wiring resistance up to the heating resistance element. If a plurality of heating resistance elements connected to the same wiring line are designed to be simultaneously drivable, the voltage drop difference greatly changes in accordance with the difference in the number of simultaneously driven heating resistance elements owing to the common resistance of the wiring line. Appropriate bubbling may not be obtained depending on image data.

For this reason, a plurality of wiring lines are so divided as to have the same resistance in manufacturing a printhead, and heaters connected to a common wiring line are time-divisionally driven so as to drive only one heating resistance element at once. This configuration suppresses the adverse effect of the common wiring line upon a change in the number of simultaneously driven heating resistance elements.

FIG. 23 is a plan view showing the structure of a conventional inkjet printhead substrate having a plurality of wiring lines.

In FIG. 23, reference numeral 1100 denotes an inkjet printhead substrate; 1104, electrode pads; and 1108, individual wiring lines.

FIG. 24 is a diagram showing the equivalent circuit of a part which forms the substrate shown in FIG. 23.

More specifically, the equivalent circuit of a part circled in FIG. 23 corresponds to the circuit shown in FIG. 24.

In FIG. 24, reference numerals 1103 denote heating resistance elements (heaters); 1107, MOS transistors serving as driving elements for driving the heating resistance elements 1103; 1104*a*, an electrode pad for applying a voltage for supplying energy to the heating resistance elements 1103; 1104*b*, a GND wiring electrode pad for supplying energy to the heating resistance elements 1103; 1104*c*, a voltage application power supply input pad for determining a voltage to be finally applied to the gates of the MOS transistors; and 1104*d*, a power supply input pad which is actually formed from a plurality of electrode pads (not shown) and drives a logic circuit. The pad 1104*d* includes electrode pads for GND, image data input, time division driving, and logic necessary to determine the heating resistance element driving time.

Reference numerals 1112-(1) to 1112-(*n*) and 1113-(1) to 1113-(*n*) denote individual wiring resistances generated because wiring lines are individually laid out for respectively heating resistance elements to be simultaneously driven (on the logic circuit).

Reference numeral 1109 denotes a driving element driving voltage converter serving as an element which stabilizes a voltage input from the electrode pad 1104*c* and if necessary, reduces the voltage; 1110, a logic circuit including a shift register (S/R), latch circuit, time division signal determination circuit, and driving time determination signal generation circuit; and 1111, a synthesizing circuit which increases a voltage of a logic control signal to the driving voltage of the MOS transistor 1107.

The MOS transistor 1107 is turned on on the basis of image data, a time division signal, a driving time determination signal, and the like which are synthesized by the logic circuit 1110 and synthesizing circuit 1111. A current then flows through the heating resistance element (heater) 1103 to generate heat by the energy, and ink is discharged by power obtained by film foaming of ink in contact with the heating resistance element 1103.

When attention is paid to a given time, only one of heating resistance elements in each portion surrounded by a dotted line in FIG. 24 is driven. In other words, when each of portions surrounded by dotted lines is regarded as a block, one of heaters belonging to each block is driven at once. This driving is called block time division driving.

The operating points of driving elements for simultaneously driven heaters will be explained with reference to FIGS. 25 and 26.

FIG. 25 shows an equivalent circuit extracted from the equivalent circuit shown in FIG. 24 for only one division part of heating resistance elements simultaneously driven by block time division driving out of a plurality of heating resistance elements.

In FIG. 25, RH represents the resistance value of one of simultaneously driven heating resistance elements; RL1, the wiring resistance value of one individual wiring line 1112-(*x*) (where x=1, n) shown in FIG. 24; RL2, the wiring resistance value of one individual wiring line 1113-(*x*) (where x=1, n) shown in FIG. 24; and RC1 and RC2, common wiring resistance values generated in an electrical wiring tape and electrical contact substrate following common wiring lines of individual wiring lines, like the electrode pads 1104*a* and 1104*b*.

In FIG. 25, VH represents a voltage which is generated by supplying power to the heating resistance element 1103 and driving it and applied between the individual wiring line+the heating resistance element+the heater driving element (MOS transistor); $I_{DS}$, a current flowing upon driving; and $V_{DS}$, a voltage generated between the drain and source of the MOS transistor 1107.

Symbols "D", "G", and "S" around the MOS transistor 1107 represent the drain, gate, and source, respectively.

The resistance values RC1 and RC2 generated at portions other than portions on a substrate of silicon (Si) or the like exist outside the substrate, and thus the degree of freedom of design is high so that a wiring thickness can be thickened. As a result, the resistance value can be decreased.

FIG. 26 is a graph showing a current difference when a number of simultaneous driven heating resistance elements change due to fluctuation of RC1 and RC2.

A conventional heater driving element is configured to operate in the non-saturation region of a MOS transistor where the performance is high when, e.g., commonly using a power supply voltage applied to the heating resistance element. In this case, the difference in VH caused by the difference of resistance values between simultaneously driven heating resistance elements arises from only the voltage difference caused by the difference in resistance values RC1 and RC2 much smaller than the resistance value of the heating resistance element and the total current. Within this range, current variations fall within a range where ink can be stably discharged, as shown in FIG. 26.

As is apparent from FIG. 26, however, the operating point (□: for a large number of simultaneously driven heating resistance elements, ■: a small number of simultaneously driven heating resistance elements) of the current $I_{DS}$ resultantly flowing through the heating resistance element changes depending on the number of simultaneously driven heating resistance elements. The current difference desirably falls within about 5% in terms of the design, and the circuit of the inkjet printhead substrate must be designed under very strict conditions.

Recently, as the inkjet printing apparatus advances in speed and image quality more and more, a printhead mounted on the apparatus and a circuit board used for the printhead must be equipped with a larger number of heating resistance elements, and the printhead must be driven at high frequencies.

In order to drive many heating resistance elements, the time division count must be increased in block time division driving. By increasing the time division count, a larger number of heating resistance elements can be driven without changing the number of wiring lines. However, the driving time assigned to each heating resistance element becomes shorter, and must be further shortened for higher-frequency driving.

In order to stably discharge ink from the printhead, energy applied to each heating resistance element must be controlled. For this purpose, a method of controlling energy applied to the heating resistance element by changing the driving time of the heating resistance element has conventionally been employed. However, even this method still requires a certain driving time, and the driving time has already reached its limit in the conventional method.

In order to increase the number of heating resistance elements without changing the driving time and drive them at the same frequency, the number of simultaneously driven heating resistance elements must be increased. Since the time division count is decreased for higher-frequency driving, the number of simultaneously driven heating resistance elements must be increased further. Hence, to increase the number of simultaneously driven heating resistance elements in the conventional wiring method, the number of individual wiring lines must be increased.

Individual wiring lines have different lengths because distances from electrode pads at the periphery of the substrate to heating resistance elements differ. To make the resistance values of individual wiring lines coincide with each other, their widths are designed such that the width is the narrowest for an individual wiring line closest to an electrode pad and becomes broader for farther individual wiring lines, as shown in FIG. 23. However, the minimum wiring width is limited by the manufacture, and a thicker wiring line is required as the number of wiring lines increases. In practice, when the number of simultaneously driven heating resistance elements is doubled, the wiring width increases three or four times, resulting in an abrupt increase in substrate size.

In the future, the number of heating resistance elements of the printhead will increase, and higher printing speeds will be required. Along with this, the number of simultaneously driven heating resistance elements inevitably increases. Thus, VH voltage fluctuation depending on the difference in the number of simultaneously driven heating resistance elements caused by the common wiring lines RC1 and RC2 as shown in FIG. 25 becomes large. This adversely affects the stability of ink discharge and the durability of the printhead.

Another problem will be discussed.

FIG. 27 is a block diagram showing a representative example of the configuration of an element substrate for a conventional inkjet printhead (see U.S. Pat. No. 6,116,714).

As shown in FIG. 27, an element substrate 900 comprises a plurality of heaters (printing elements) 901 which are parallel-arrayed and supply thermal energy for discharge to ink, power transistors (drivers) 902 which drive the heaters 901, a shift register 904 which receives externally serially input image data and serial clocks synchronized with the image data, and receives image data for each line, a latch circuit 903 which latches image data of one line output from the shift register 904 in synchronism with a latch clock and parallel-transfers the image data to the power transistors 902, a plurality of AND gates 915 which are respectively arranged in correspondence with the power transistors 902 and supply output signals from the latch circuit 903 to the power transistors 902 in accordance with an external enable signal, and input terminals 905 to 912 which externally receive image data, various signals, and the like. Of these input terminals, the terminal 910 is a printing element driving GND terminal, and the terminal 911 is a printing element driving power supply terminal.

The element substrate 900 further comprises a sensor monitor 914 such as a temperature sensor for measuring the temperature of the element substrate 900, or a resistance monitor for measuring the resistance value of each heater 901. A printhead in which a driver, a temperature sensor, a driving controller, and the like are integrated in an element substrate has already been commercially available, and contributes to improvement of the printhead reliability and downsizing of the apparatus.

In this configuration, image data input as serial signals are converted into parallel signals by the shift register 904, output to the latch circuit 903, and latched by it in synchronism with a latch clock. In this state, driving pulse signals for the heaters 901 (enable signals for the AND gates 915) are input via an input terminal, and the power transistors 902 are turned on in accordance with the image data. A current then flows through corresponding heaters 901, and ink in the liquid channels (nozzles) is heated and discharged as droplets from orifices at the distal ends of the nozzles.

FIG. 28 is a view showing in detail a part associated with variations in parasitic resistance on the element substrate for the inkjet printhead shown in FIG. 27.

A parasitic resistance (or constant voltage) component 916 which leads to a loss in supplying energy to the printing element upon application of a constant power supply voltage from the printing apparatus main body exists in the power transistor 902 (which is a bipolar transistor in this case, but may be a MOS transistor) shown in FIGS. 27 and 28, and a common power supply wiring line and GND wiring line for driving a plurality of printing elements. Further, in areas 2801 and 2802 encircled by broken lines as shown in FIG. 28, a voltage generated by the parasitic resistance 916 changes depending on the number of simultaneously driven heaters 901, and as a result, energy applied to the heater 901 varies.

The area 2801 contains a parasitic resistance component 2801*a* present in a power supply wiring line of the inkjet printing apparatus, a parasitic resistance component 2801*b* present in a power supply wiring line of the inkjet printhead, and a parasitic resistance component 2801*c* in a common power supply wiring line. Likewise, the area 2802 contains a parasitic resistance component 2802*a* present in a GND wiring line of the inkjet printing apparatus, a parasitic resistance component 2802*b* present in a GND wiring line of the inkjet printhead, and a parasitic resistance component 2802*c* in a common GND wiring line.

In practice, as shown in FIG. 28, the heaters 901 serving as printing elements inevitably vary in absolute resistance value by ±20% to 30% in mass production owing to the difference in film thickness and its distribution in the substrate manufacturing process.

From this, a power transistor has been used as a driver for driving the printing element of an available inkjet printhead in order to mainly reduce the resistance. The power transistor 902 functions as a constant power supply having an opposite bias to a constant element driving power supply, or an ON resistance. Since a current flowing through the printing element 901 changes depending on variations in the resistance of the printing element, energy (power consumption) applied to the printing element during a predetermined time greatly changes depending on the resistance value of the printing element in the manufacture.

The energy change has conventionally been coped with by changing by the resistance of the printing element a pulse width applied to drive the printing element. With this measure, power consumption of the printing element is made constant so as to stably discharge ink by driving the inkjet printhead and achieve a long service life of the printhead.

In recent years, the number of necessary printing elements greatly rises for higher printing speed. At the same time, it becomes more necessary than a conventional printing apparatus to uniform energy applied to the printing element for higher printing resolution. As described above, as the difference in the number of simultaneously driven printing elements becomes larger, energy applied to the printing elements more greatly varies, and the service life of the printhead becomes shorter. This generates a fault such as degradation of the printing quality owing to energy variations.

As a recent technique, the driver part is so controlled as to supply a constant current to each heater in a configuration having an effect of making energy constant, as shown in FIG. 29. This configuration can solve the above-described problem because a constant current always flows through each heater and energy, i.e., (resistance value of heater)×(square of constant current value) is supplied regardless of the number of simultaneously driven printing elements unless the resistance value varies during use. A configuration which keeps a current flowing through the heater constant has also been proposed (see, e.g., U.S. Pat. No. 6,523,922).

Among the printhead substrates, the resistance of the printing element (heating resistance element) which is the largest among resistance components varies by about 20% to 30% owing to manufacturing variations, as described above. Note that the same reference numbers are added to the same constituent elements or matters as those described in FIGS. 27 and 28, and the description is omitted. Since the power supply voltage of the printing apparatus main body in a conventional mechanism is constant, energy applied to the printing element is made constant by adjusting a pulse width applied to the printing element upon variations in the resistance of the printing element, as also described above.

However, when a constant current is commonly supplied to the heaters of a plurality of substrates in order to eliminate variations in energy caused by the difference in the number of simultaneously driven printing elements, like the prior art, the power loss on the inkjet printhead substrate by variations in the resistance of the printing element greatly changes.

FIG. 30 is a table showing variations in power loss when the printing element is driven at a constant current.

The example shown in FIG. 30 assumes variations in voltage generated at both ends of the heater and manufacturing variations in heater (in this case ±20%) when the resistance value of the printing element is about 100Ω and a 150-mA current is supplied as a constant current. FIG. 30 shows the ratio of energy consumed by constituent components other than the printing element when the printing element has a maximum resistance (120Ω), 1 V is necessary to control the driver voltage for a voltage (18 V) between both ends of the printing element, and a voltage (19 V) higher by 1 V is applied on the printing apparatus side in order to control a constant current. The power consumption of the printing element upon supply of a constant current changes (1.8 to 2.7 W) depending on variations (80 to 120Ω) in the resistance value of the printing element. Upon variations, application power is adjusted by changing the pulse width applied to the printing element in actual printing.

FIG. 30 also shows pulse widths necessary when energy is made constant.

In FIG. 30, as indicated in a dotted area 3001, when the resistance value of the printing element is 80Ω, about 58% of power applied to the printing element is mainly consumed (power loss) by a control part (driver part in the inkjet printhead substrate) for supplying a constant current. In order to make energy applied to the printing element constant even though the resistance value changes, the application pulse width is adjusted to 1.25 μs for a printing element resistance of 80Ω and 0.83 μs for a printing element resistance of 120Ω. As understood from a comparison between values in dotted areas 3002 and 3003, the ratio of these application pulse widths is about 1.5 times, and the difference in loss energy is different by about 10 times between the printing element resistances of 80Ω and 120Ω.

Particularly, when the resistance value of the printing element is 80Ω, about 58% of energy applied to the printing element is lost. On the other hand, when the resistance value of the printing element is 120Ω, the lost is about 6%. Thus, heat generated in the substrate also varies depending on the resistance value of the printing element.

If all the power is consumed within the inkjet printhead substrate, the substrate temperature goes up. This influences the ink discharge amount.

FIG. 31 is a graph showing the relationship between the printing time and the substrate temperature when a constant current is supplied to the inkjet printhead substrate.

As is apparent from FIG. 31, the degree of rise of the substrate temperature changes upon variations in the resistance of the printing element.

FIG. 32 is a graph showing the relationship between the ink temperature and the ink discharge amount.

As is apparent from FIG. 32, as the ink temperature changes, the ink discharge amount also changes. Since the ink temperature is influenced by the substrate temperature, the rise of the substrate temperature influences the ink discharge characteristic.

Hence, the fact that variations by about 20% to 30% in the resistance value of the printing element in manufacturing the printhead cannot be avoided means that it is very difficult to provide an inkjet printhead having uniform ink discharge performance.

As described above, when the method of driving the printing element at a constant current in order to eliminate the difference caused by a change in the number of simultaneously driven printing elements is introduced, energy is wastefully consumed owing to variations in the resistance value of the printing element in the printhead manufacturing process. Moreover, in actual printing, the temperature variation characteristic of the substrate changes, and the printing performance of the printhead greatly varies upon a change in ink viscosity or the like depending on the ink temperature.

SUMMARY OF THE INVENTION

Accordingly, the present invention is conceived as a response to the above-described disadvantages of the conventional art.

For example, a printhead substrate according to the present invention is capable of suppressing an increase in wiring width and an increase in the size of a substrate formed by a film forming process while increasing the number of simultaneously driven printing elements in order to improve the printing performance.

According to one aspect of the present invention, preferably, there is provided a printhead substrate having a plurality of printing elements, and driving elements which are arranged in correspondence with the plurality of printing elements, switch and control driving of corresponding printing elements, and are formed from MOS transistors, comprising: a common wiring line which commonly supplies power, and to which a plurality of simultaneously drivable printing elements out of the plurality of printing elements are connected; and a first pad which supplies power to the common wiring line, wherein each of the driving elements is an element for supplying a constant current to the printing elements.

Desirably, the plurality of printing elements are electrothermal transducers, and one terminal of each of the electrothermal transducers is connected to the common wiring line, and the other terminal is connected to a drain of the MOS transistor.

The MOS transistor desirably operates in a drain-source current saturation region.

The printhead substrate desirably further comprises a logic circuit which controls the plurality of driving elements, a GND wiring line which corresponds to the common wiring line and is shared over a plurality of blocks, and a second pad which connects the GND wiring line.

The printhead substrate may further comprise a setting circuit which sets a gate width of a MOS transistor for energizing the printing element, and a driving circuit which drives the MOS transistor having the gate width set by the setting circuit.

In addition, the printhead substrate may further comprise a resistance having a value representative of resistance values of the printing elements, wherein the setting circuit sets the gate width on the basis of the resistance value.

Desirably, the MOS transistor is formed from a plurality of small MOS transistors which are connected to the printing element and have different gate widths, and the substrate comprises a storage element which stores the number of MOS transistors for each printing element that are so driven as to determine an optimal current value from the representative resistance value and set a sum of saturation currents of the small MOS transistors to the optimal current value, and a circuit which determines a total gate width of the MOS transistors that are turned on on the basis of the storage element.

Note that, in the above printhead substrate, the printing element may be substantially equivalently connected to the common wire line, or the common wire line is connected to the printing elements as a single wire line without branch out.

Further note that the common wire line may be strip-like.

According to another aspect of the present invention, preferably, there is provided a printhead in which the printhead substrate having the above configuration is built in.

The printhead may further comprise a nonvolatile memory which stores a printing element driving voltage of the printhead substrate, a current value, a driving pulse width, and MOS transistor gate width setting information.

The printhead desirably includes an inkjet printhead. In this case, an electrothermal transducer in the inkjet printhead generates thermal energy to be applied to ink in order to discharge ink by using thermal energy.

According to still another aspect of the present invention, preferably, there is provided a head cartridge including the inkjet printhead and an ink tank containing ink to be supplied to the inkjet printhead.

According to still another aspect of the present invention, preferably, there is provided a printing apparatus which prints by using the printhead or head cartridge having the above configuration.

The printing apparatus preferably sets a gate width of a MOS transistor, and applies a power supply voltage and a driving pulse to a printing element on the basis of printhead setting information present in the printhead.

According to still another aspect of the present invention, preferably, there is provided a printhead driving method of driving the printhead having the above configuration.

The method comprises the step of driving a plurality of driving elements at a constant current when time-divisionally dividing a plurality of printing elements into a plurality of blocks and driving the plurality of printing elements.

The method preferably further comprises a measurement step of measuring a value of a resistance (monitoring manufacturing variations) representative of resistance values of the plurality of printing elements arranged on a printhead substrate, a setting step of setting a gate width of a MOS transistor when driving one printing element, reflecting the resistance value measured in the measurement step, and a control step of controlling to operate the MOS transistor in a saturation region by applying a voltage to the printing element on the basis of a setting condition.

In the setting step, a pulse width of a pulse signal used to drive the printing element is desirably set to adjust energy applied to the plurality of printing elements.

In this manner, a method of driving a printhead excellent in printing characteristic regardless of variations in the resistance value of the printing element is implemented without greatly changing a conventional configuration.

The setting circuit of the printhead substrate which implements the printhead driving method desirably comprises an additional circuit for adjusting the current. The setting circuit desirably sets the pulse width of the pulse signal used to drive the printing element in order to adjust energy applied to the plurality of printing elements.

The invention is particularly advantageous since energy applied to the printing element is made constant by driving the printing element of the printhead at a constant current, variations in energy applied to the printing element upon a change in the number of simultaneously driven printing elements can be suppressed, and high-quality printing can be achieved.

By forming a common wiring line which commonly supplies power to a plurality of blocks for time division driving, an increase in wiring width can be suppressed to contribute to downsizing of the printhead.

Further, the value of the resistance which represents the resistance values of the printing elements arranged on the printhead substrate is measured, and a current value to be supplied to the printing element is set on the basis of the measured resistance value. Thus, even if the resistance values of printing elements vary in mass production of the printhead, an optimal current can be supplied to the printing elements to print.

As a result, high-quality printing excellent in printing characteristic with a small power loss can be realized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 19 is a table showing setting of a current value when the resistance value of printing element varies;

FIG. 30 is a table showing variations in power loss when the printing element is driven at a constant current;

DETAILED DESCRIPTION OF THE PREFERRED EMBODIMENTS

Preferred embodiments of the present invention will now be described in detail in accordance with the accompanying drawings.

In this specification, the terms "print" and "printing" not only include the formation of significant information such as characters and graphics, but also broadly includes the formation of images, figures, patterns, and the like on a print medium, or the processing of the medium, regardless of whether they are significant or insignificant and whether they are so visualized as to be visually perceivable by humans.

Also, the term "print medium" not only includes a paper sheet used in common printing apparatuses, but also broadly includes materials, such as cloth, a plastic film, a metal plate, glass, ceramics, wood, and leather, capable of accepting ink.

Furthermore, the term "ink" (to be also referred to as a "liquid" hereinafter) should be extensively interpreted similar to the definition of "print" described above. That is, "ink" includes a liquid which, when applied onto a print medium, can form images, figures, patterns, and the like, can process the print medium, and can process ink (e.g., can solidify or insolubilize a coloring agent contained in ink applied to the print medium).

Furthermore, unless otherwise stated, the term "nozzle" generally means a set of a discharge orifice, a liquid channel connected to the orifice and an element to generate energy utilized for ink discharge.

The term "element substrate" used in the following description means not only a base of a silicon semiconductor but also a base having elements, wiring lines, and the like. "On an element substrate" means not only "on an element base", but also "on the surface of an element base" and "inside an element base near the surface".

The term "built-in" in the present invention means not "to arrange separate elements on a base", but "to integrally form or manufacture elements on an element base by a semiconductor circuit manufacturing process or the like".

A representative overall configuration and control configuration of a printing apparatus using a printhead according to the present invention will be described.

<Description of Inkjet Printing Apparatus (FIG. 1)>

Figure 1:
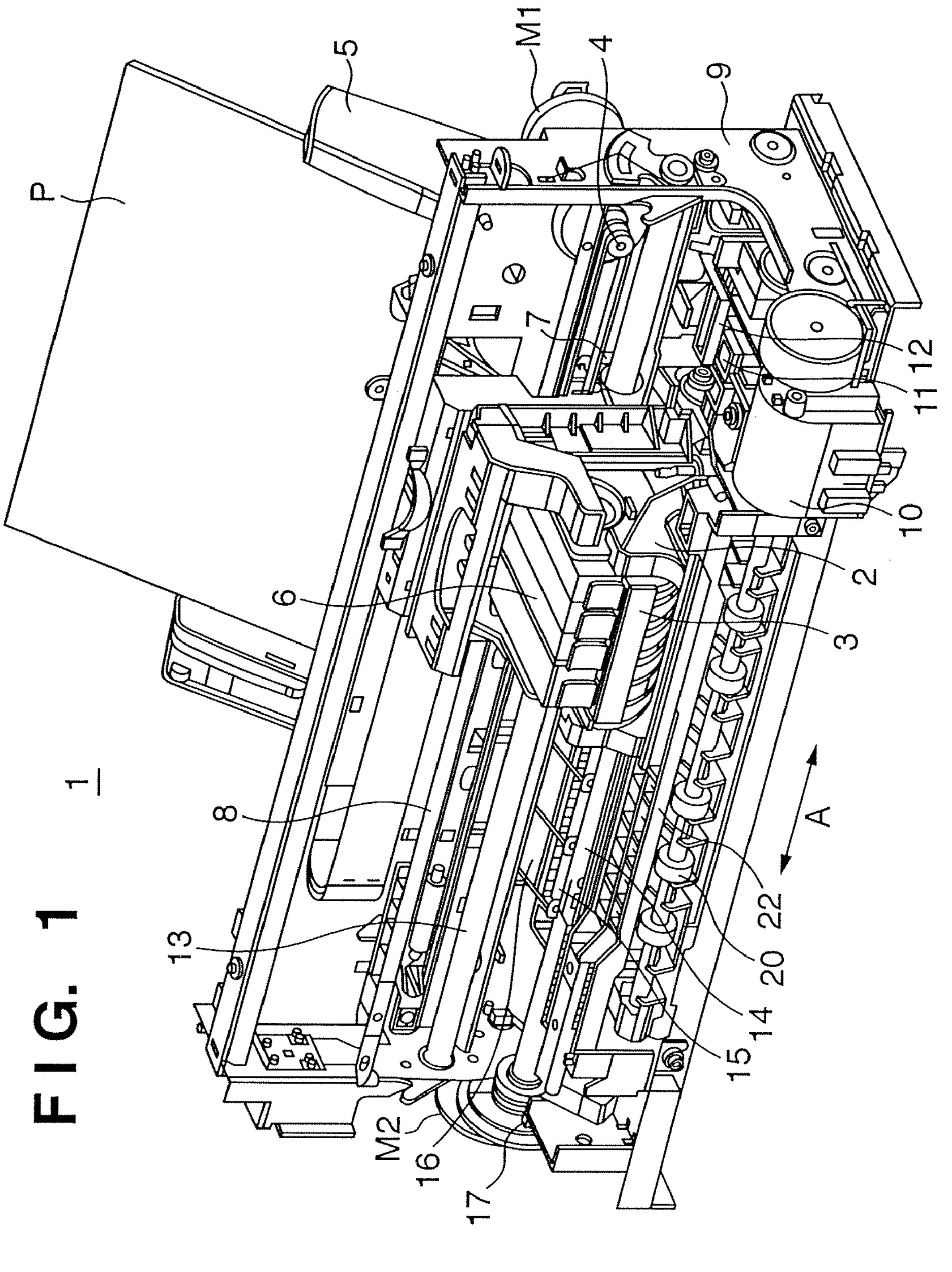
FIG. 1 is an outer perspective view showing the schematic arrangement of an inkjet printing apparatus 1 as a typical embodiment of the present invention.

FIG. 1 is an outer perspective view showing the schematic arrangement of an inkjet printing apparatus 1 as a typical embodiment of the present invention.

The inkjet printing apparatus 1 (hereinafter referred to as the printer) shown in FIG. 1 performs printing in the following manner. Driving force generated by a carriage motor M1 is transmitted from a transmission mechanism 4 to a carriage 2 incorporating a printhead 3, which performs printing by discharging ink in accordance with an inkjet method, and the carriage 2 is reciprocally moved in the direction of arrow A. A printing medium P, e.g., printing paper, is fed by a paper feeding mechanism 5 to be conveyed to a printing position, and ink is discharged by the printhead 3 at the printing position of the printing medium P, thereby realizing printing.

To maintain an excellent state of the printhead 3, the carriage 2 is moved to the position of a recovery device 10, and discharge recovery processing of the printhead 3 is intermittently performed.

In the carriage 2 of the printer 1, not only the printhead 3 is mounted, but also an ink cartridge 6 reserving ink to be supplied to the printhead 3 is mounted. The ink cartridge 6 is attachable/detachable to/from the carriage 2.

The printer 1 shown in FIG. 1 is capable of color printing. Therefore, the carriage 2 holds four ink cartridges respectively containing magenta (M), cyan (C), yellow (Y), and black (K) inks. These four cartridges are independently attachable/detachable.

Appropriate contact between the junction surfaces of the carriage 2 and the printhead 3 can achieve necessary electrical connection. By applying energy to the printhead 3 in accordance with a printing signal, the printhead 3 selectively discharges ink from plural discharge orifices, thereby performing printing. In particular, the printhead 3 according to this embodiment adopts an inkjet method which discharges ink by utilizing heat energy, and comprises electrothermal transducers for generating heat energy. Electric energy applied to the electrothermal transducers is converted to heat energy, which is then applied to ink, thereby creating film boiling. This film boiling causes growth and shrinkage of a bubble in the ink, and generates a pressure change. By utilizing the pressure change, ink is discharged from the discharge orifices. The electrothermal transducer is provided in correspondence with each discharge orifice. By applying a pulsed voltage to the corresponding electrothermal transducer in accordance with a printing signal, ink is discharged from the corresponding discharge orifice.

As shown in FIG. 1, the carriage 2 is connected to a part of a driving belt 7 of the transmission mechanism 4 which transmits driving force of the carriage motor M1, and is slidably supported along a guide shaft 13 in the direction of arrow A. Therefore, the carriage 2 reciprocally moves along the guide shaft 13 in accordance with normal rotation and reverse rotation of the carriage motor M1. In parallel with the moving direction of the carriage 2 (direction of arrow A), a scale 8 is provided to indicate an absolute position of the carriage 2. In this embodiment, the scale 8 is a transparent PET film on which black bars are printed in necessary pitches. One end of the scale 8 is fixed to a chassis 9, and the other end is supported by a leaf spring (not shown).

In the printer 1, a platen (not shown) is provided opposite to the discharge orifice surface where discharge orifices (not shown) of the printhead 3 are formed. As the carriage 2 incorporating the printhead 3 is reciprocally moved by the driving force of the carriage motor M1, a printing signal is supplied to the printhead 3 to discharge ink, and printing is performed on the entire width of the printing medium P conveyed on the platen.

Furthermore, in FIG. 1, numeral 14 denotes a conveyance roller driven by a conveyance motor M2 for conveying the printing medium P. Numeral 15 denotes a pinch roller that presses the printing medium P against the conveyance roller 14 by a spring (not shown). Numeral 16 denotes a pinch roller holder which rotatably supports the pinch roller 15. Numeral 17 denotes a conveyance roller gear fixed to one end of the conveyance roller 14. The conveyance roller 14 is driven by rotation of the conveyance motor M2 transmitted to the conveyance roller gear 17 through an intermediate gear (not shown).

Numeral 20 denotes a discharge roller for discharging the printing medium P, where an image is formed by the printhead 3, outside the printer. The discharge roller 20 is driven by receiving rotation of the conveyance motor M2. Note that the discharge roller 20 presses the printing medium P by a spur roller (not shown) that presses the printing medium by a spring. Numeral 22 denotes a spur holder which rotatably supports the spur roller.

Furthermore, as shown in FIG. 1, the printer 1 includes the recovery device 10 for recovering discharge failure of the printhead 3, which is arranged at a desired position (e.g., a position corresponding to the home position) outside the reciprocal movement range for printing operation (outside the printing area) of the carriage 2 that incorporates the printhead 3.

The recovery device 10 comprises a capping mechanism 11 for capping the discharge orifice surface of the printhead 3, and a wiping mechanism 12 for cleaning the discharge orifice surface of the printhead 3. In conjunction with the capping operation of the capping mechanism 11, suction means (suction pump or the like) of the recovery device enforces ink discharge from the discharge orifices, thereby executing discharge recovery operation, that is, removing high-viscosity ink and bubbles in the ink channel of the printhead 3.

In addition, when printing operation is not performed, the discharge orifice surface of the printhead 3 is capped by the capping mechanism 11 for protecting the printhead 3 and preventing ink from evaporation and drying. The wiping mechanism 12 is arranged in the neighborhood of the capping mechanism 11 for wiping off an ink droplet attached to the discharge orifice surface of the printhead 3.

By virtue of the capping mechanism 11 and wiping mechanism 12, a normal ink discharge condition of the printhead 3 can be maintained.

<Control Configuration of Inkjet Printing Apparatus (FIG. 2)>

Figure 2:
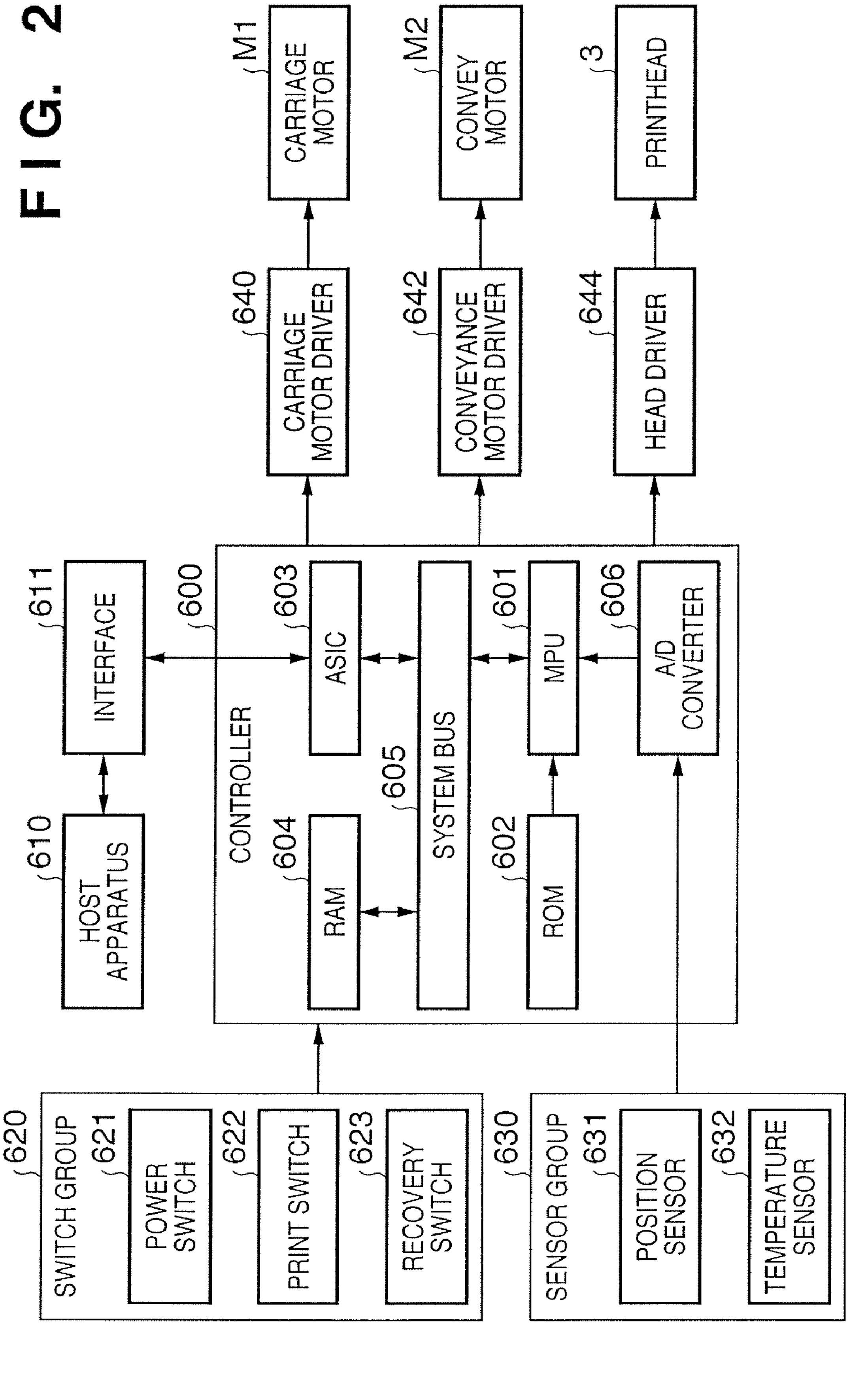
FIG. 2 is a block diagram showing the control configuration of the printing apparatus shown in FIG. 1.

FIG. 2 is a block diagram showing a control structure of the printer shown in FIG. 1.

Referring to FIG. 2, a controller 600 comprises: an MPU 601; ROM 602 storing a program corresponding to the control sequence which will be described later, predetermined tables, and other fixed data; an Application Specific Integrated Circuit (ASIC) 603 generating control signals for controlling the carriage motor M1, conveyance motor M2, and printhead 3; RAM 604 providing an image data developing area or a working area for executing a program; a system bus 605 for mutually connecting the MPU 601, ASIC 603, and RAM 604 for data transmission and reception; and an A/D converter 606 performing A/D conversion on an analog signal inputted by sensors which will be described later and supplying a digital signal to the MPU 601.

In FIG. 2, numeral 610 denotes a computer serving as an image data supplying source (or an image reader, digital camera or the like), which is generically referred to as a host unit. Between the host unit 610 and printer 1, image data, commands, status signals and so forth are transmitted or received via an interface (I/F) 611.

Numeral 620 denotes switches for receiving commands from an operator, which includes a power switch 621, a print switch 622 for designating a print start, and a recovery switch 623 for designating a start of the processing (recovery processing) aimed to maintain an excellent ink discharge state of the printhead 3. Numeral 630 denotes sensors for detecting an apparatus state, which includes a position sensor 631 such as a photo-coupler for detecting a home position h, and a temperature sensor 632 provided at an appropriate position of the printer for detecting an environmental temperature.

Numeral 640 denotes a carriage motor driver which drives the carriage motor M1 for reciprocally scanning the carriage 2 in the direction of arrow A. Numeral 642 denotes a conveyance motor driver which drives the conveyance motor M2 for conveying the printing medium P.

When the printhead 3 is scanned for printing, the ASIC 603 transfers driving data (DATA) of the printing element (discharge heater) to the printhead 3 while directly accessing the storage area of the RAM 602.

The printhead main body comprises a power supply circuit (not shown) which applies to the printhead a power supply voltage for driving the printing element of the printhead.

In the above description, a control program executed by the MPU 601 is stored in the ROM 602. Alternatively, an erasable and programmable storage medium such as an EEPROM can be further added to allow the host apparatus 610 connected to the printing apparatus 1 to change a control program.

Figure 3:
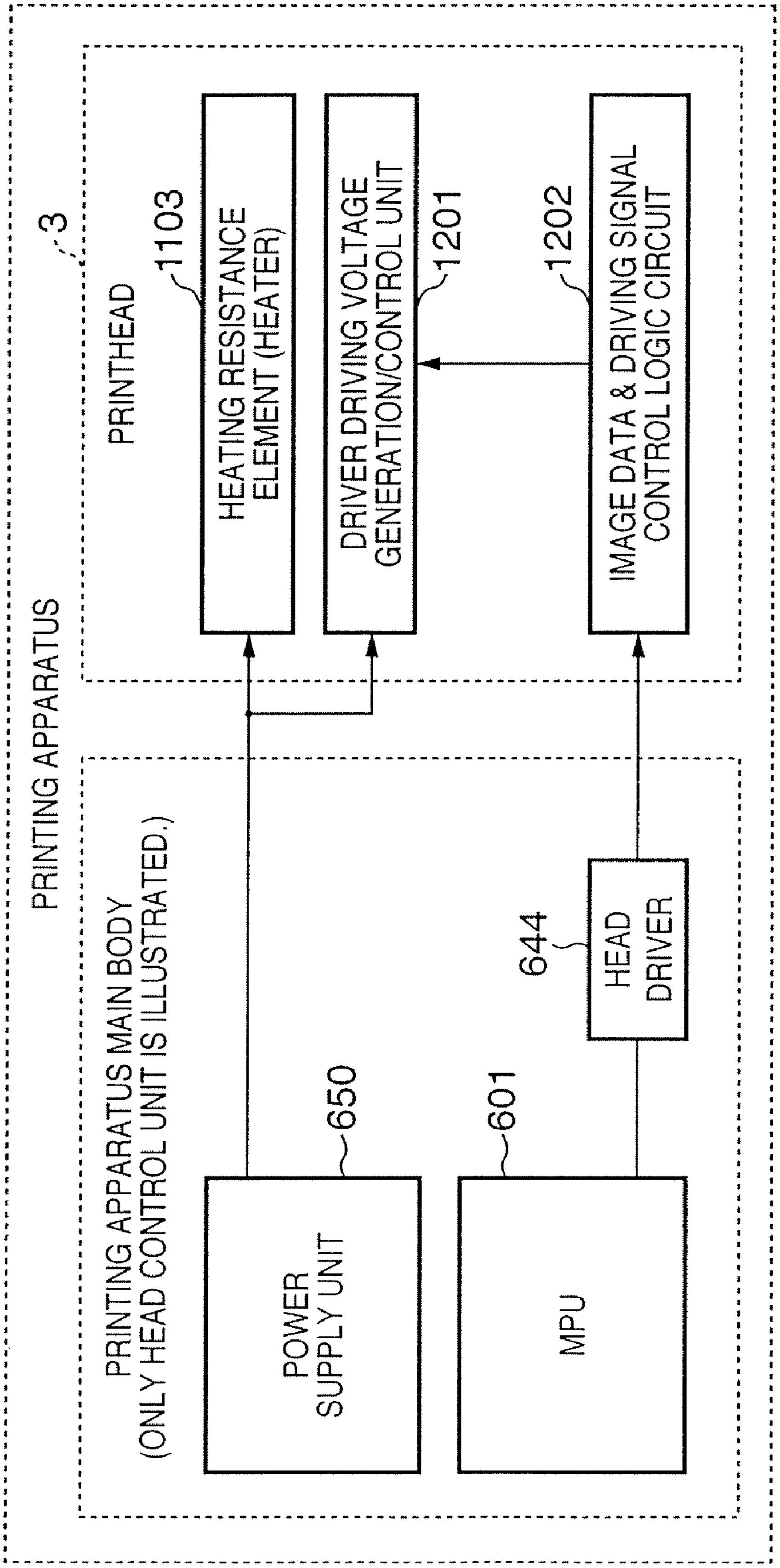
FIG. 3 is a block diagram showing only constituent components which are extracted from the configuration shown in FIG. 2 and associated with driving of a printhead.

FIG. 3 is a block diagram showing only constituent components which are extracted from the configuration shown in FIG. 2 and associated with driving of the printhead.

In FIG. 3, the printhead 3 is driven by control of the MPU 601 and head driver 644 and power supply from a power supply unit 650. The printhead 3 comprises a heating resistance element (heater) 1103 which applies thermal energy to ink in order to discharge ink droplets, a driver driving voltage generation/control unit 1201 which drives a driver (not shown) to energize the heater, and an image data & driving signal control logic circuit (logic circuit) 1202 which receives an image output and driving control signal via the head driver 644 and drives the driver.

When attention is paid to the printing apparatus main body, the printing apparatus main body can employ a general configuration without any change.

Figure 4A:
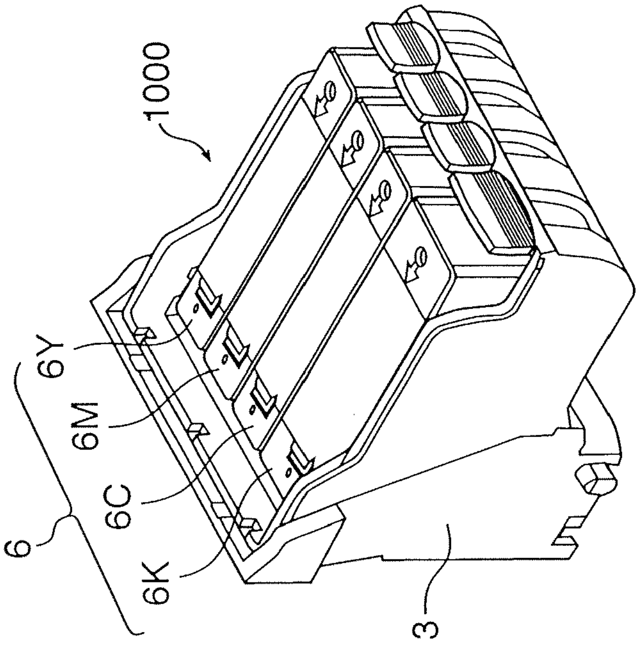
FIGS. 4A and 4B are perspective views showing the outer appearance of a printhead cartridge 1000 which is formed from a printhead and ink tanks.
Figure 4B:
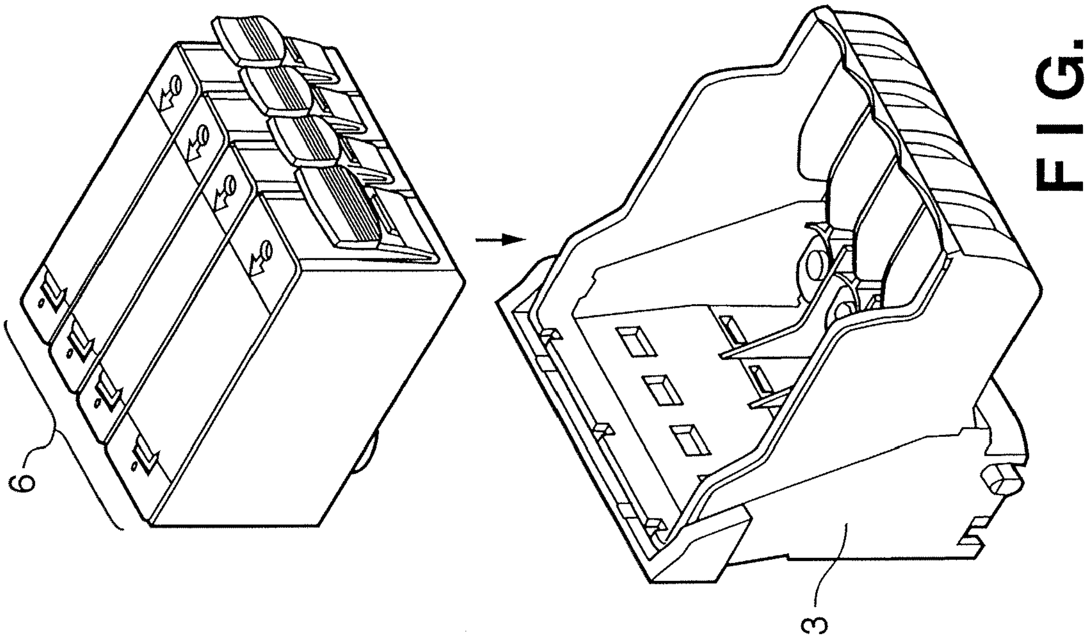

FIGS. 4A and 4B are perspective views showing the outer appearance of a printhead cartridge 1000 which is formed from a printhead and ink tanks.

As is apparent from FIGS. 4A and 4B, the printhead cartridge 1000 is formed from four ink tanks 6 and the printhead 3 which can be separated from each other. FIG. 4A shows a state in which the four ink tanks 6 are mounted on the printhead 3, and FIG. 4B shows a state in which the four ink tanks 6 are dismounted from the printhead 3.

The ink tanks 6 are four ink tanks 6Y, 6C, 6M, and 6K which respectively contain an yellow (Y) ink, cyan (C) ink, magenta (M) ink, and black (K) ink. These ink tanks can be individually dismounted from the printhead and exchanged when they run out of ink.

The printhead cartridge 1000 is fixed and supported by the positioning means and electrical contact of the carriage 2 on the printing apparatus main body, and is detachable from the carriage 2.

The printhead 3 is a bubble-jet side-shooter type printhead which prints by using a heating resistance element (heater) for generating thermal energy for causing film boiling in ink in accordance with an electrical signal by discharging ink to an opposite side of a surface of the heating resistance element.

Figure 5:
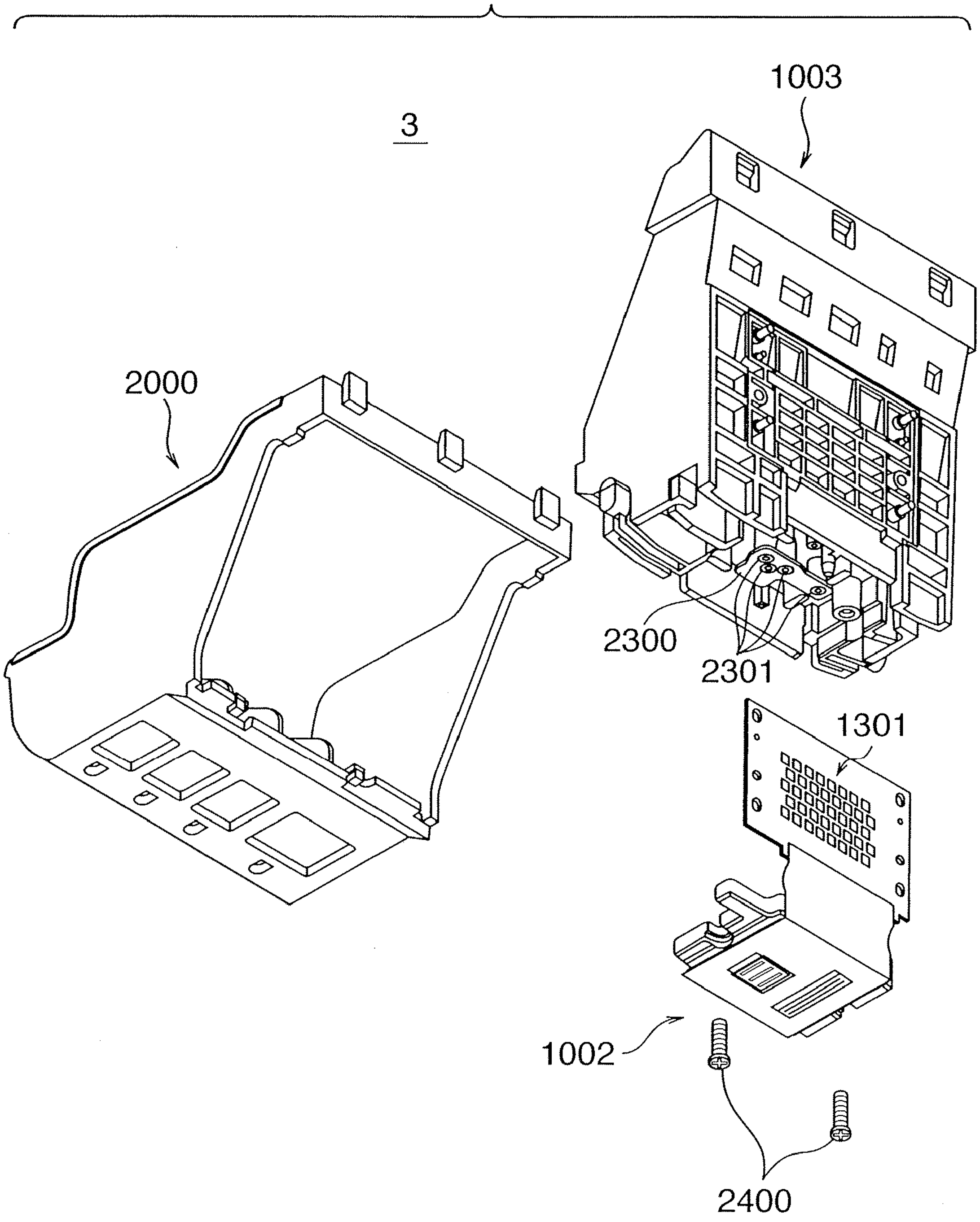
FIG. 5 is an exploded perspective view showing the detailed configuration of a printhead 3.

FIG. 5 is an exploded perspective view showing the detailed configuration of the printhead 3.

As shown in FIG. 5, the printhead 3 comprises a printing element unit 1002 which integrates a plurality of heating resistance elements (heaters), an ink supply unit 1003, and a tank holder 2000 which holds the four ink tanks. The printing element unit 1002 and ink supply unit 1003 are fixed with screws 2400 via a joint seal member 2300 so that the ink communication ports (not shown) of the printing element unit 1002 and ink communication ports 2301 of the ink supply unit 1003 communicate with each other without ink leakage.

Figure 6:
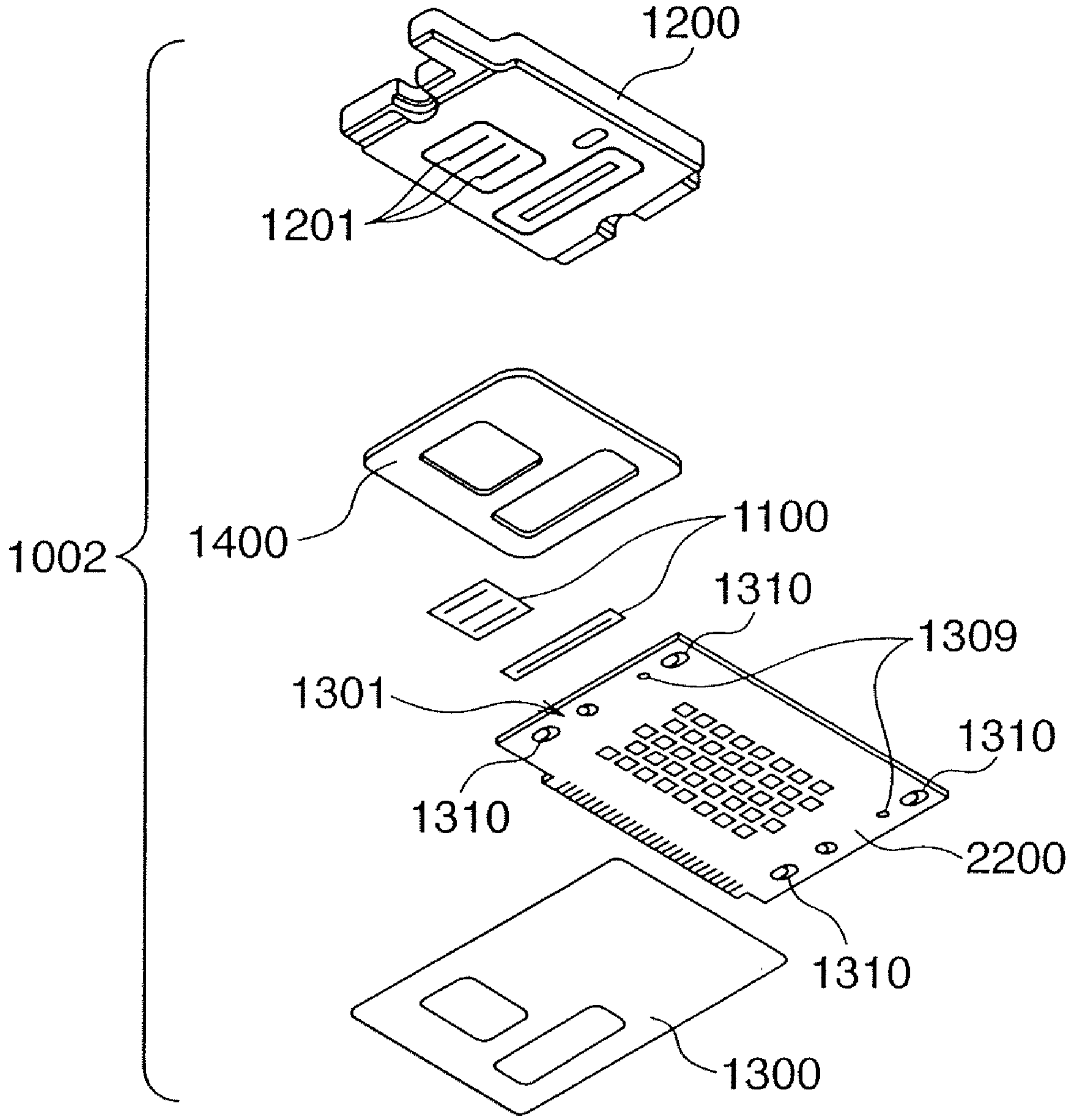
FIG. 6 is an exploded perspective view showing the detailed configuration of a printing element unit 1002.

FIG. 6 is an exploded perspective view showing the detailed configuration of the printing element unit 1002.

As shown in FIG. 6, the printing element unit 1002 comprises two inkjet printhead substrates (to be referred to as substrates hereinafter) 1100, a plate 1200 serving as the first support member, an electrical wiring tape (flexible wiring board) 1300, an electrical contact substrate 2200, and a plate 1400 serving as the second support member.

As shown in FIG. 6, the substrates 1100 are bonded and fixed to given portions of ink communication ports 1201 of the plate 1200. The plate 1400 having openings is bonded and fixed to the plate 1200, and the electrical wiring tape 1300 is bonded and fixed to the plate 1400. The plate 1200, electrical wiring tape 1300, and plate 1400 hold a predetermined positional relationship with the substrates 1100.

The electrical wiring tape 1300 supplies an electrical signal for discharging ink to the substrates 1100. The electrical wiring tape 1300 has electrical wiring lines corresponding to the substrates 1100, and is connected to the electrical contact substrate 2200 having an external signal input terminal 1301 for receiving an electrical signal from the inkjet printing apparatus main body. The electrical contact substrate 2200 is positioned and fixed to the ink supply unit 1003 via terminal positioning holes 1309 (at two portions).

Figure 7:
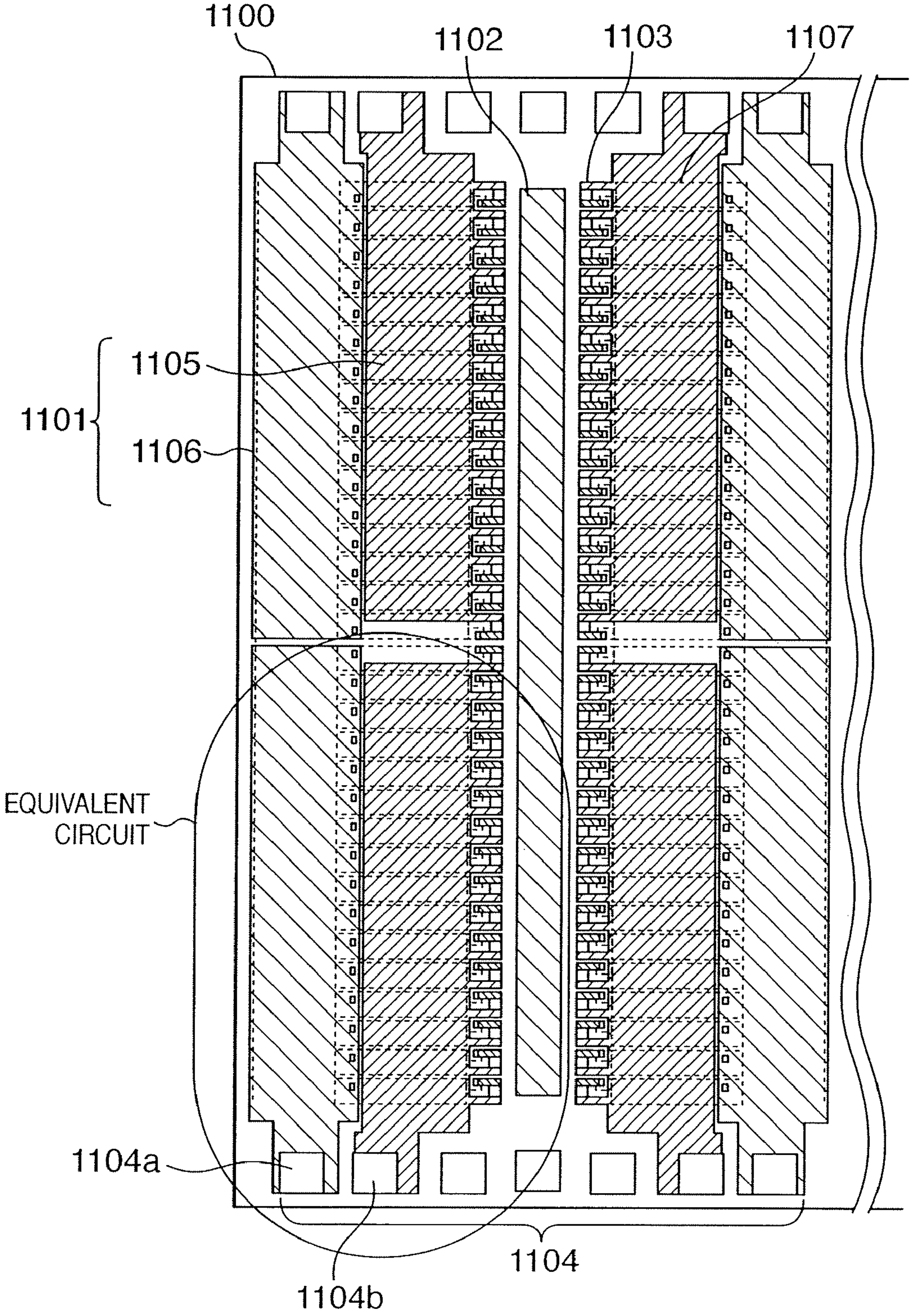
FIG. 7 is a plan view showing the structure of an inkjet printhead substrate 1100.

FIG. 7 is a plan view showing the structure of the inkjet printhead substrate (to be referred to as a substrate) 1100.

As shown in FIG. 7, the substrate 1100 has a plurality of heating resistance elements 1103 for discharging ink on one surface of an Si substrate having 0.5 to 1 mm thickness. A plurality of ink channels (not shown) and a plurality of ink orifices (not shown) corresponding to the heating resistance elements 1103 are formed on the substrate 1100 by photolithography.

An ink supply port 1102 for supplying ink to a plurality of ink channels is formed in correspondence with the ink communication ports 1201 formed in the plate 1200 so that the ink supply port 1102 is open on the opposite surface (back side surface). The heating resistance elements 1103 are staggered in line each on the two sides of the ink supply port 1102. Heater driving elements (to be referred to as driving elements hereinafter) 1107 which turn on/off the heating resistance elements 1103 are arrayed subsequently to the heating resistance elements 1103. Since the ink orifices face the heating resistance elements 1103, ink supplied from the ink supply port 1102 is discharged from the orifices by bubbles produced by heat generated by the heating resistance elements 1103.

In order to supply an electrical signal for discharging ink to the substrate 1100, bumps (projections: not shown) on electrode pads 1104 of the substrate 1100 that are fixed to the plate 1200 and the electrode leads (not shown) of the electrical wiring tape 1300 are electrically joined by thermal ultrasonic bonding or the like. The substrate 1100 shown in FIG. 7 has a plurality of electrode pads. When these electrode pads are generally named, the reference numeral "1104" is used, and when electrode pads are individually referred to, small letter alphabets are added to the reference numeral "1104".

One terminal of each of the heating resistance element 1103 is equivalently (the resistance values from heating resistance elements to a common wiring are substantially the same) connected to a common wiring line 1105 (wiring line for supplying a power supply voltage in order to supply energy to the heating resistance element), and the other terminal is connected to the driving element 1107. The other terminal of the driving element 1107 is connected to a common wiring line 1106 (GND wiring line for applying a voltage in order to supply energy to the heating resistance element). As is apparent from FIG. 7, a wiring is shared regardless of the number of simultaneously drivable heating resistance elements in this invention, and common wiring lines 1105 and common wiring lines 1106 are divided into four blocks defined by dividing a line on each side of the ink supply port 1102 from the center. The common wiring lines

1101 are connected to electrode pads 1104*a* and 1104*b*, and electrical signals for discharging ink are respectively supplied from the electrode pads 1104*a* and 1104*b* to the heating resistance element 1103 (on the power supply side) and the driving element 1107 (on the GND side).

The ink cartridge 6 and printhead 3 may be separable, as described above, but may also be integrated to form an exchangeable head cartridge IJC.

Figure 8:
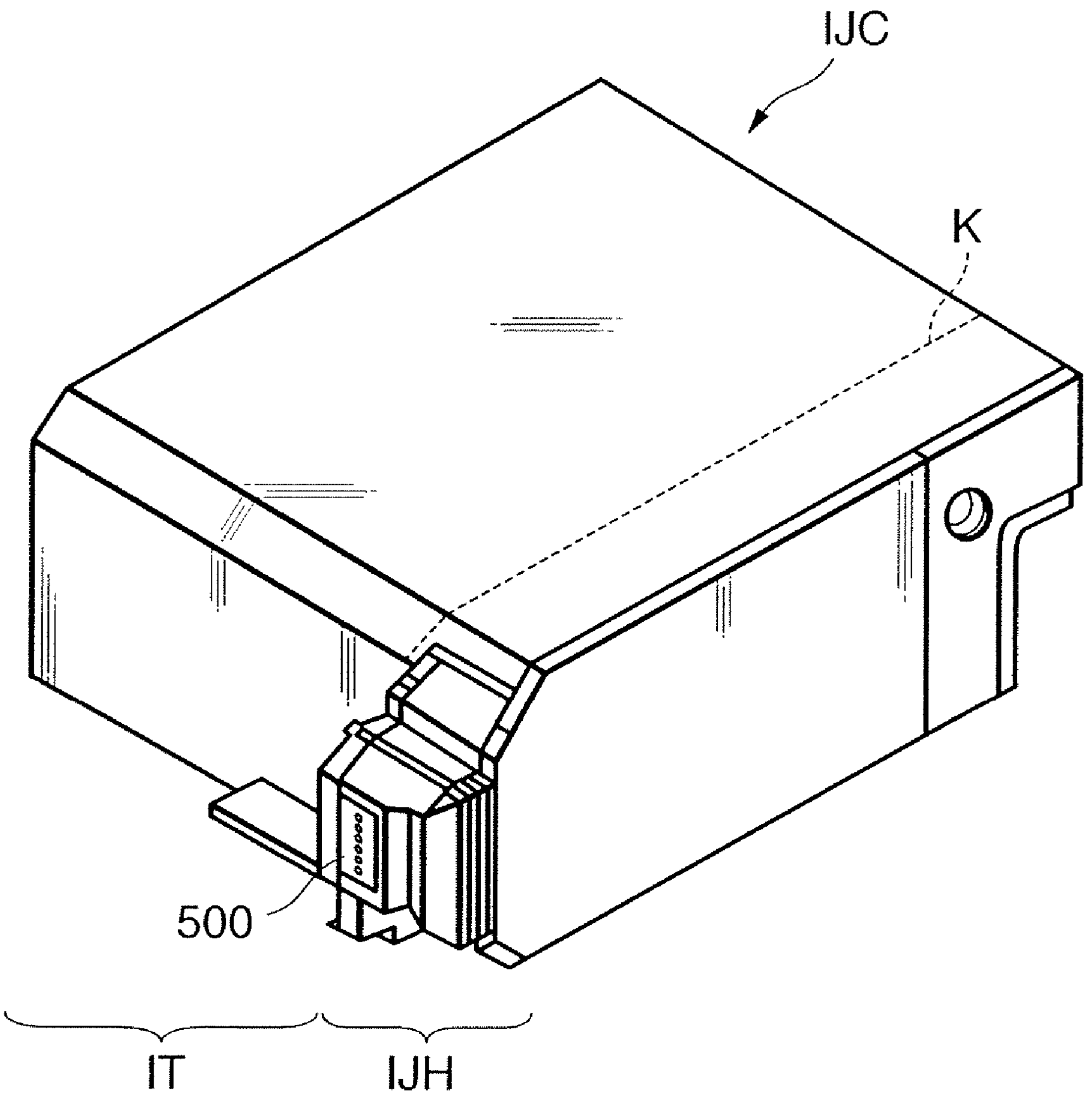
FIG. 8 is an outer perspective view showing the structure of a head cartridge obtained by integrating ink tanks and a printhead.

FIG. 8 is an outer perspective view showing the structure of the head cartridge IJC obtained by integrating the ink tanks and printhead. In FIG. 8, a dotted line K represents the boundary between an ink tank IT and a printhead IJH. The head cartridge IJC has an electrode (not shown) for receiving an electrical signal from the carriage 2 when the head cartridge IJC is mounted on the carriage 2. The electrical signal drives the printhead IJH to discharge ink, as described above.

In FIG. 8, reference numeral 500 denotes an ink orifice line. The ink tank IT incorporates a fibrous or porous ink absorber in order to hold ink.

Embodiments of the printhead according to the present invention that is mounted on the printing apparatus having the above configuration will be explained.

First Embodiment

Figure 9:
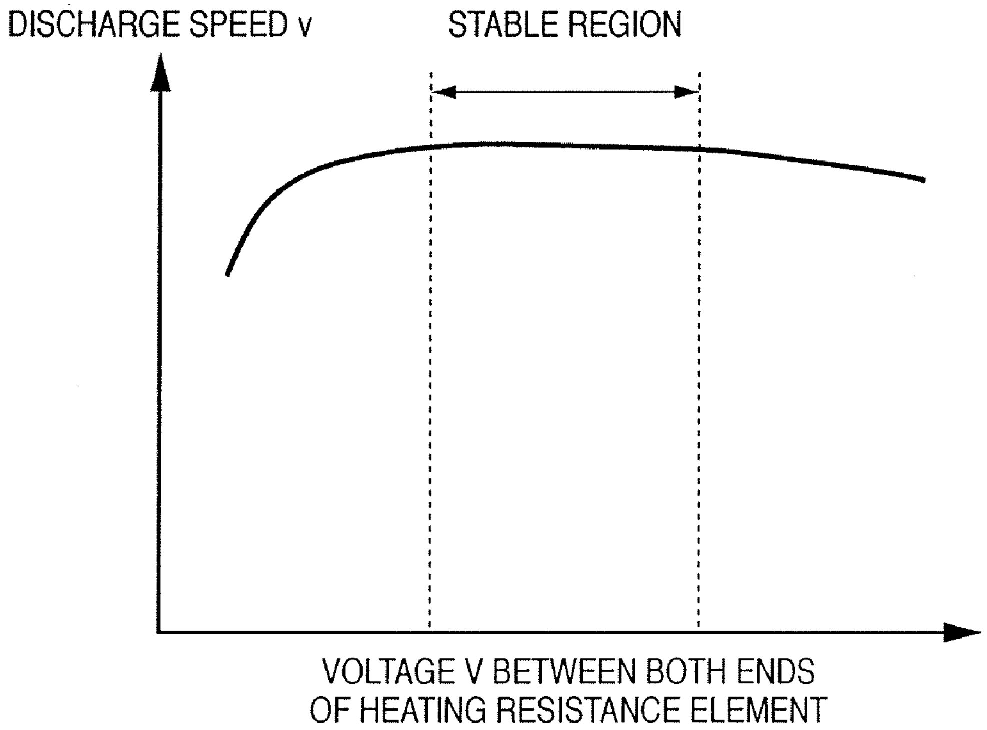
FIG. 9 is a graph showing the relationship between the ink discharge speed and the voltage between both ends of a heating resistance element.

FIG. 9 is a graph showing the relationship between the ink discharge speed and the voltage applied to both ends of the heating resistance element.

FIG. 9 represents the ink discharge state in terms of a discharge speed v as a function of a voltage V (energy E) between both ends of a heating resistance element 1103. Since the ink discharge state changes in accordance with the voltage (energy), electrode wiring lines are conventionally individually laid out up to electrode pads for a set of simultaneously driven heating resistance elements on the substrate so that the potential difference between both ends of the heating resistance element falls within a stable discharge range in accordance with the number of simultaneously driven heating resistance elements.

The range within which ink can be actually stably discharged is the range of a stable region shown in FIG. 9, and this range generally is within ±5% in view of the potential difference between both ends of the heating resistance element. However, the range must be suppressed within ±5% in view of the potential difference between electrode pads in consideration of variations in the resistance value of the heating resistance element 1103, variations in the resistance value of a common wiring line 1101, the durability of the heating resistance element 1103, and the like.

In the first embodiment, even if the number of simultaneously driven heating resistance elements increases along with future increases in printing speed and the number of nozzles, an increase in chip size (finally cost rise) caused by an increase in wiring region for a larger number of individual wiring lines in the substrate and variations in energy applied to the heating resistance element by the voltage drop difference between common wiring lines upon a change in the number of simultaneously driven heating resistance elements can be suppressed equal to or smaller than the prior art. Moreover, the driving element is downsized from the conventional one, and the operation of a MOS transistor is shifted from the non-saturation region to the saturation region. As a result, even though a plurality of simultaneously drivable heating elements are equivalently connected to a common wiring, energy applied to the heating resistance element does not deviate from the stable ink discharge range owing to the difference in the number of simultaneously driven heating resistance elements.

Figure 23:
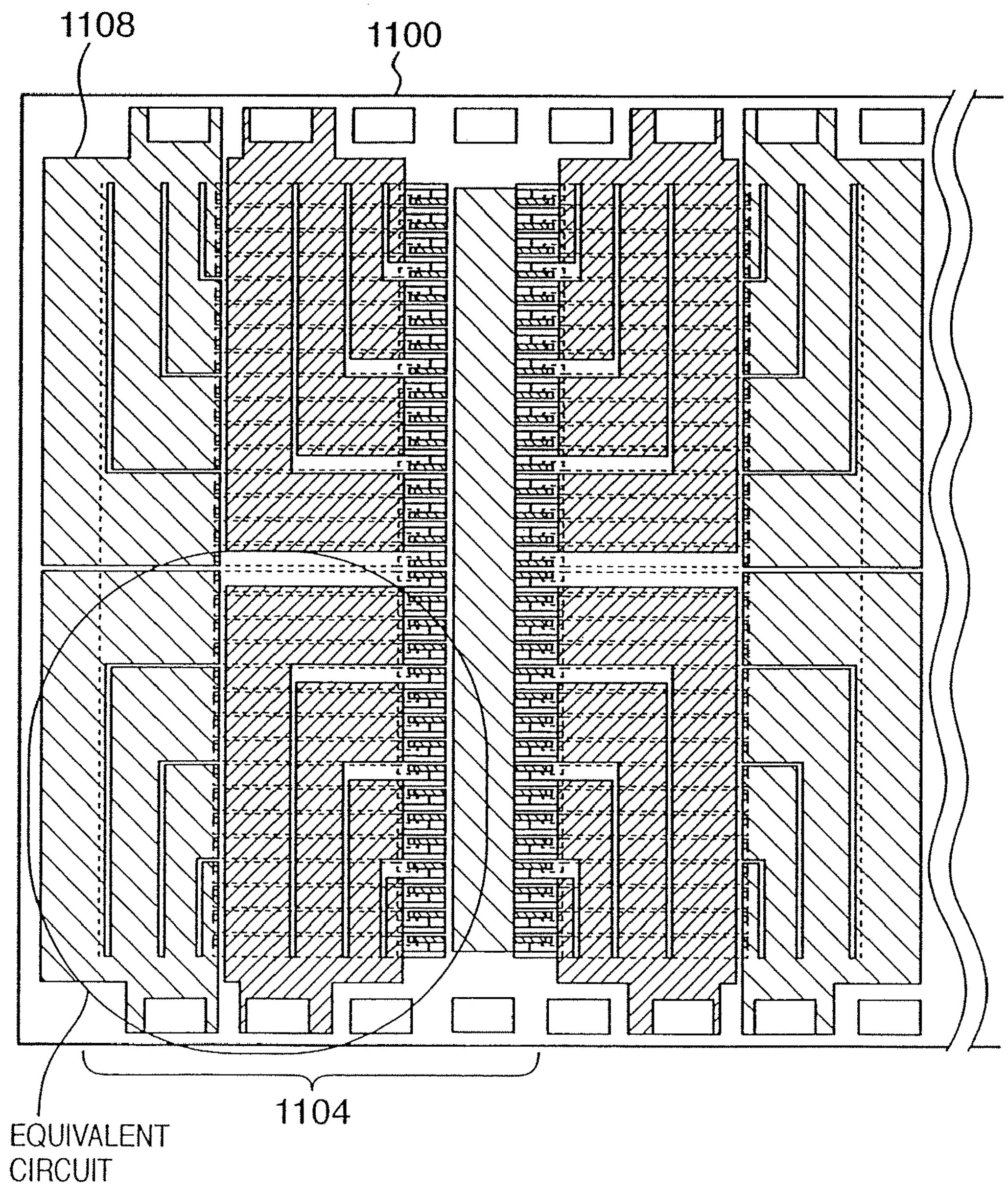
FIG. 23 PRIOR ART
FIG. 23 is a plan view showing the structure of a conventional inkjet printhead having a plurality of wiring lines.

As described above, according to this embodiment, stable drive is attained without dividing a wiring to a plurality of simultaneously drivable printing elements (heating resistance elements) into plural wirings in unit of block (without branching out a wiring in unit of block as shown in FIG. 23). Also, according to this embodiment, a plurality of simultaneously drivable printing elements can be connected by a single linear wiring.

More specifically, (1) the driving element is downsized and operated in the saturation region so that a current flowing through the heating resistance element becomes always constant regardless of the number of simultaneously driven heating resistance elements. (2) Variations in energy per unit time that is consumed by the heating resistance element is made constant by applying (1) in accordance with the number of simultaneously driven heating resistance elements, and wiring lines connected to at least two simultaneously driven blocks are formed into a common wiring line. (3) The same voltage is applied as a power supply voltage for supplying power to the heating resistance element and a power supply voltage for the driving element.

Figure 10:
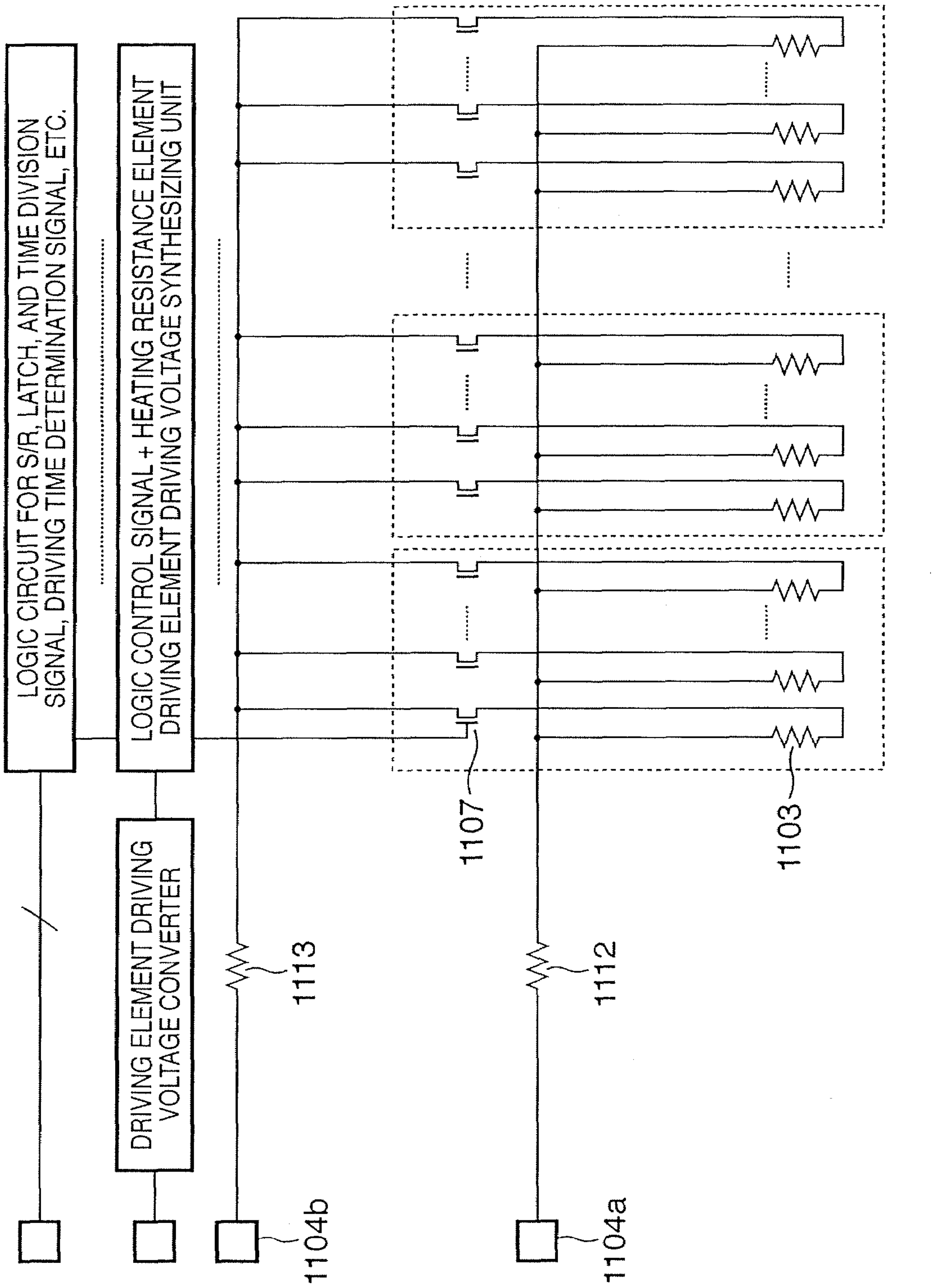
FIG. 10 is a diagram showing the equivalent circuit of a part encircled by a line in FIG. 7.

FIG. 10 is a diagram showing the equivalent circuit of a part encircled by a line in FIG. 7.

Figure 24:
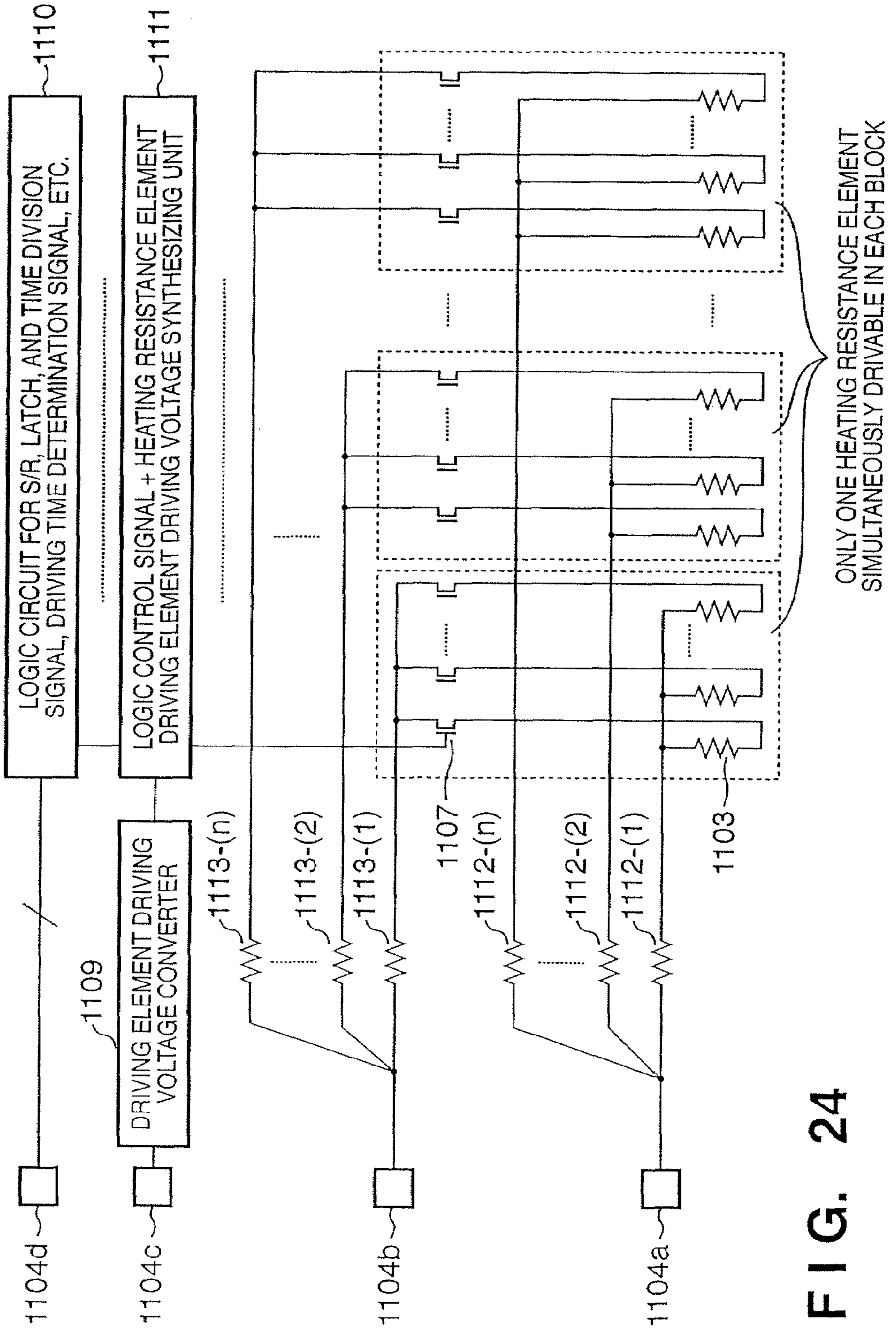
FIG. 24 PRIOR ART
FIG. 24 is a diagram showing the equivalent circuit of a part which forms the substrate shown in FIG. 23.

As is apparent from a comparison between FIGS. 10 and 24, wiring resistances 1112-(*x*) (x=1, n) and 1113-(*x*) (x=1, n) which individually exist in unit of simultaneously driven heating resistance elements in the prior art can be regarded as one resistance in FIG. 10 because a plurality of simultaneously drivable heating resistance elements are connected to a common wiring line (note that, although the resistance is simply described, as for resistances 1112 and 1113 of the common wiring line, a resistance connected to a heating resistance element arranged apart from an electrode pad increases in practice).

The operating point of the driving element upon a change in the number of simultaneously driven heating resistance elements will be explained.

Figure 11:
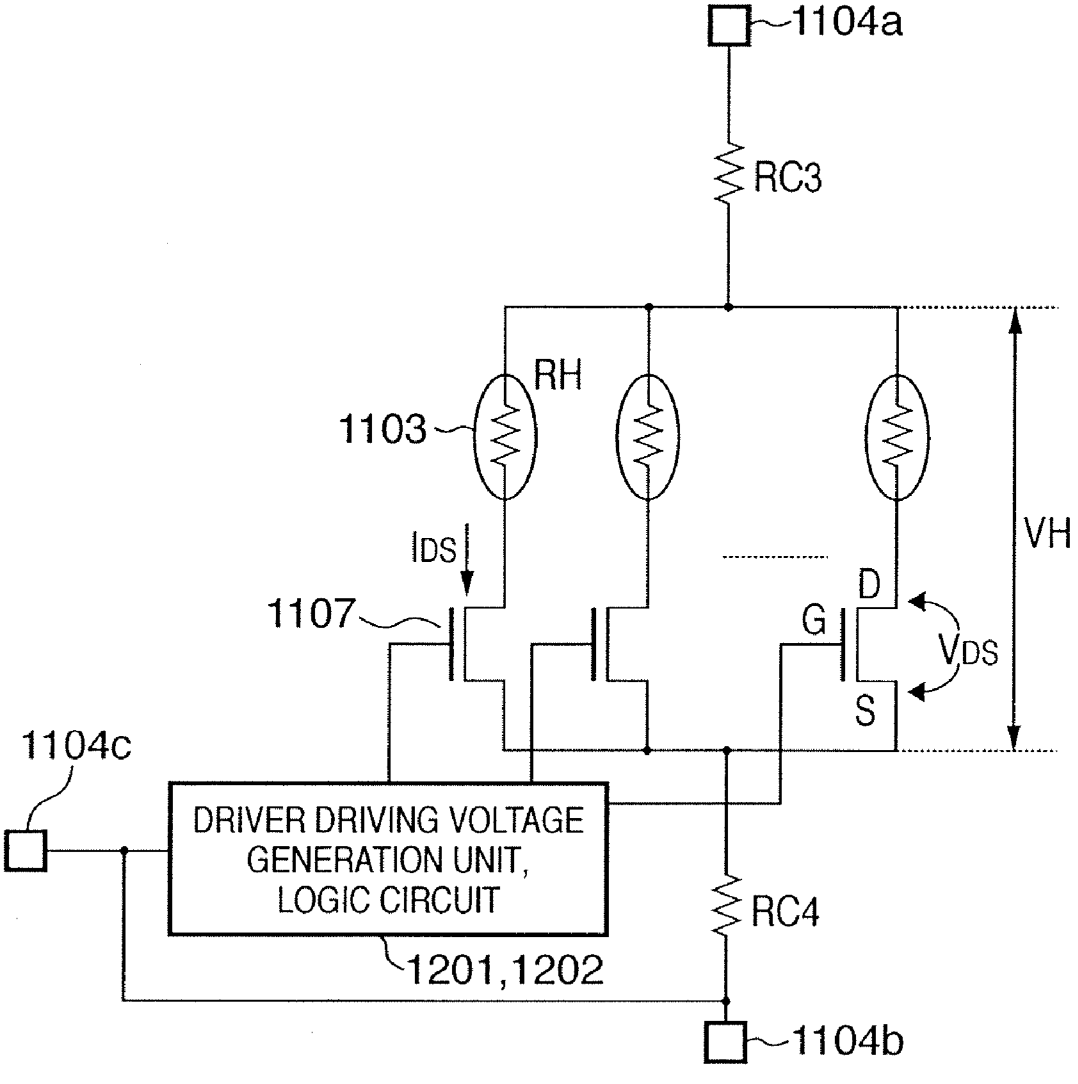
FIG. 11 is a diagram showing an equivalent circuit extracted from the equivalent circuit shown in FIG. 10 for only one division part of heating resistance elements simultaneously driven by block time division driving out of a plurality of heating resistance elements.

FIG. 11 shows an equivalent circuit extracted from the equivalent circuit shown in FIG. 10 for only one division part of heating resistance elements simultaneously driven by block time division driving out of a plurality of heating resistance elements.

Figure 25:
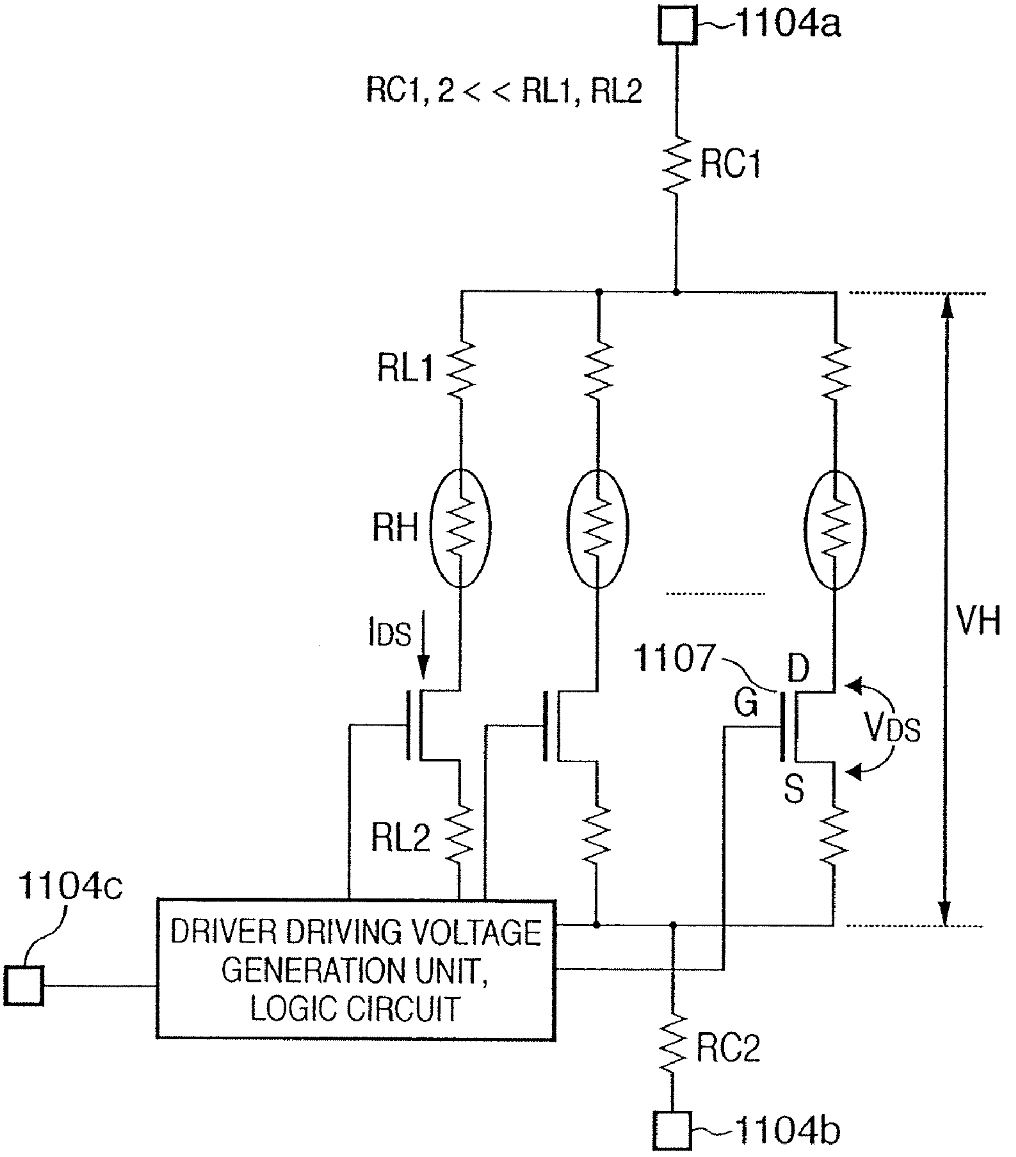
F I G. 25 PRIOR ART
FIG. 25 is a diagram showing an equivalent circuit extracted from the equivalent circuit shown in FIG. 24 for only one division part of heating resistance elements simultaneously driven by block time division driving out of a plurality of heating resistance elements.
Figure 26:
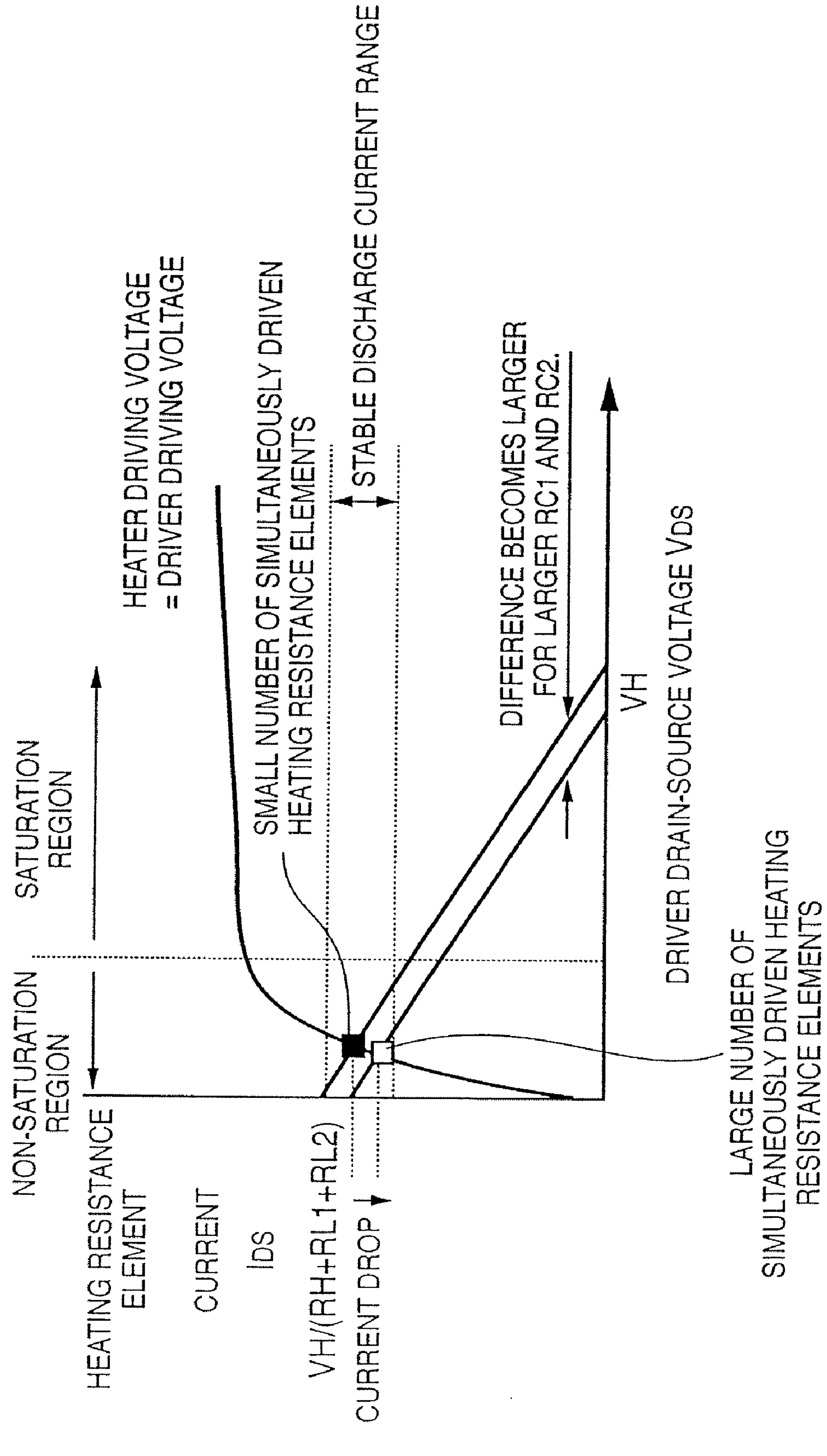
FIG. 26 PRIOR ART
FIG. 26 is a graph showing the relationship between a change in the number of simultaneously driven heating resistance elements in a conventional printhead and variations in the drain-source current ($I_{DS}$) of a MOS transistor.
Figure 27:
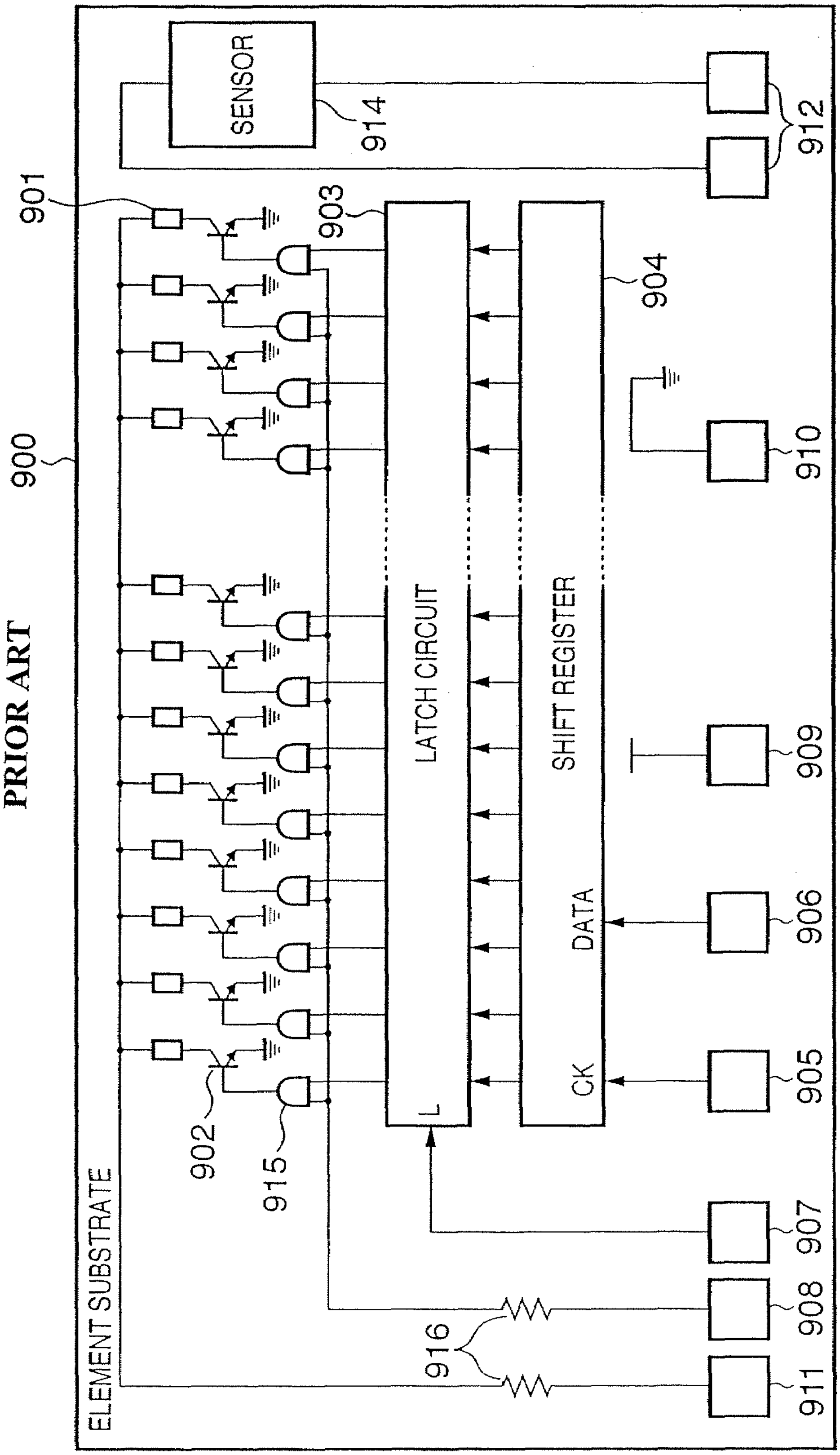
FIG. 27 PRIOR ART
FIG. 27 is a block diagram showing a representative example of the configuration of a conventional inkjet printhead substrate.
Figure 28:
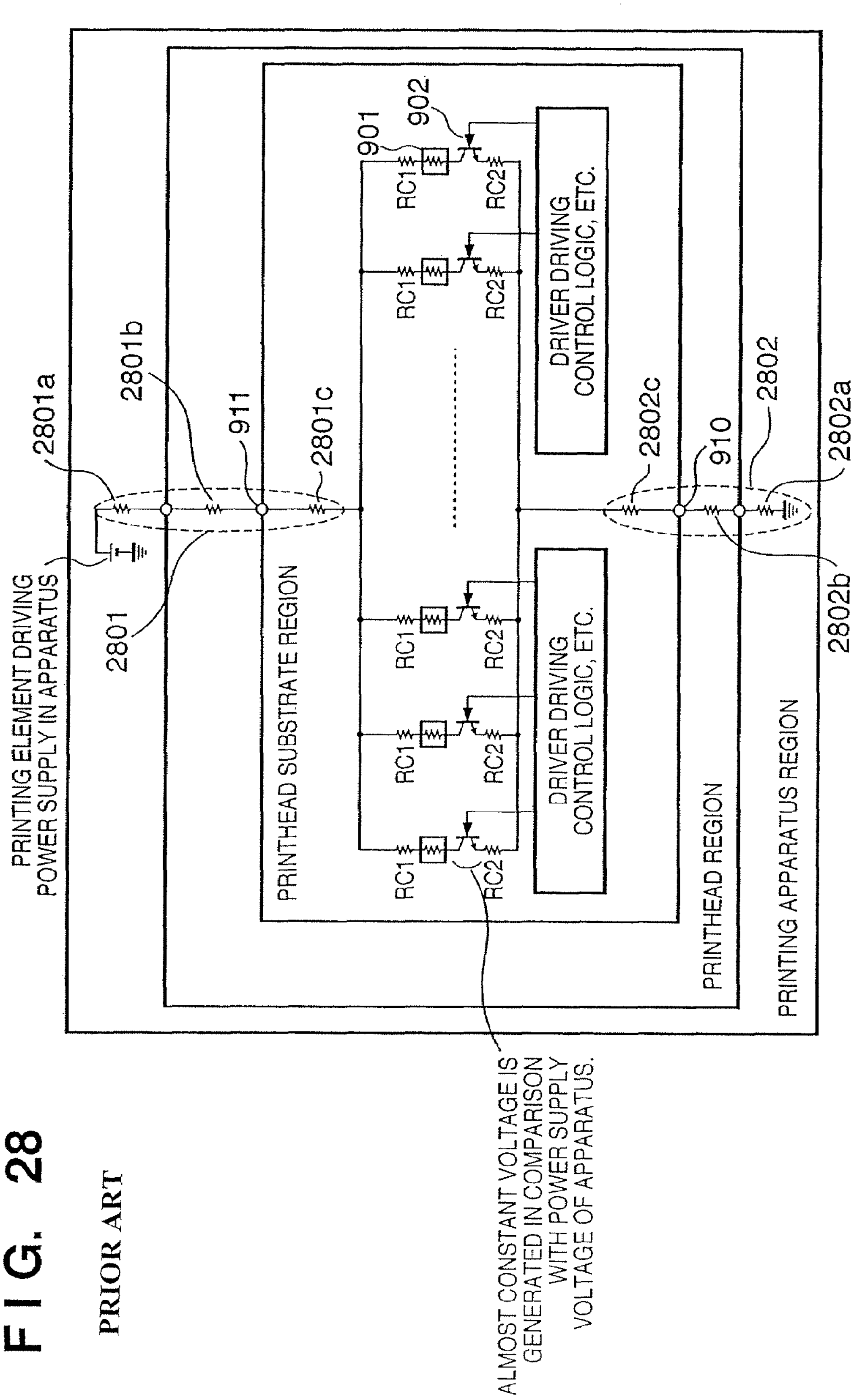
FIG. 28 PRIOR ART
FIG. 28 is a view showing in detail a part associated with variations in parasitic resistance on the inkjet printhead substrate shown in FIG. 27.
Figure 29:
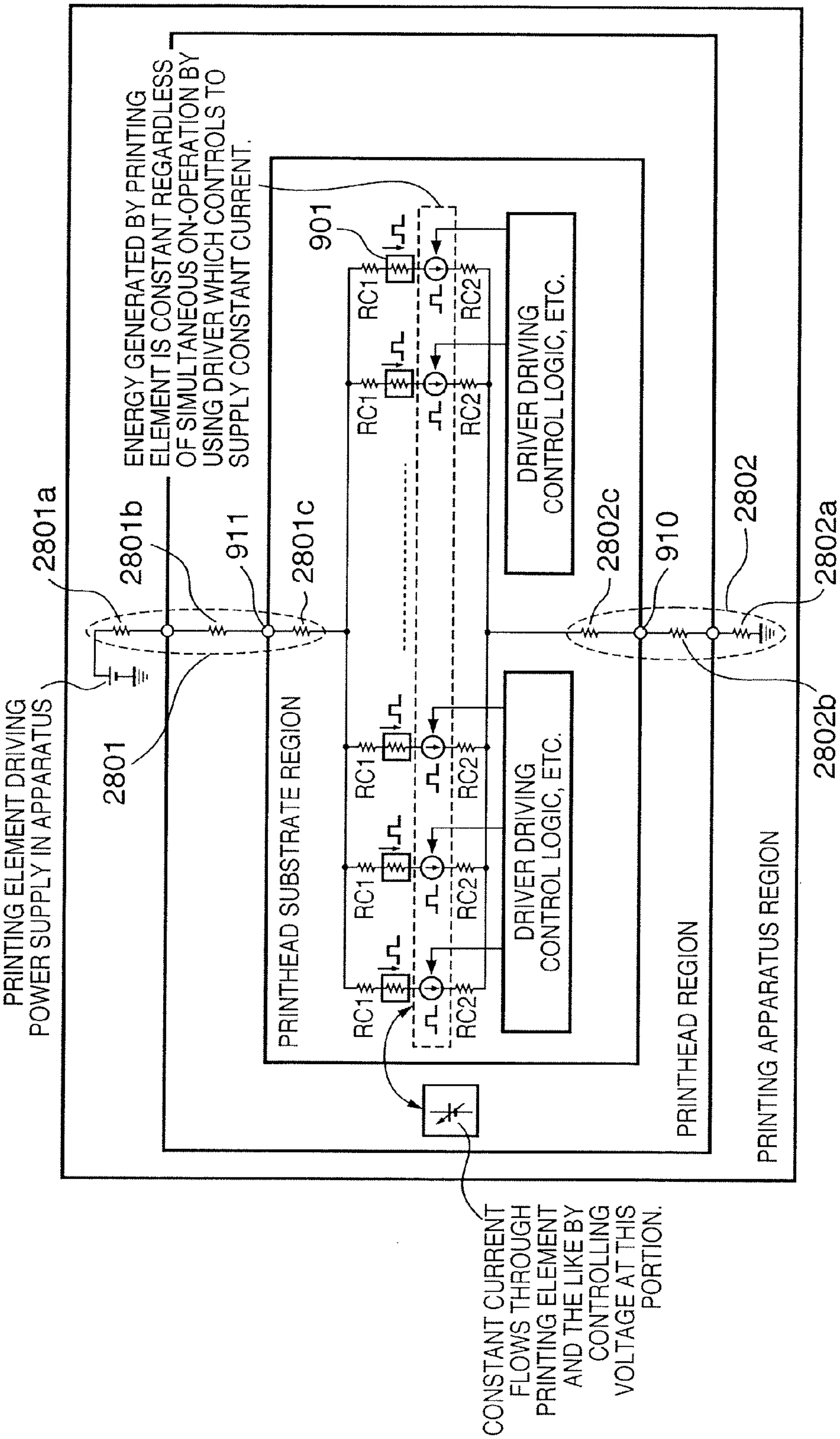
FIG. 29 is a view showing a configuration which controls a driver part so as to supply a constant current to each heater.
Figure 31:
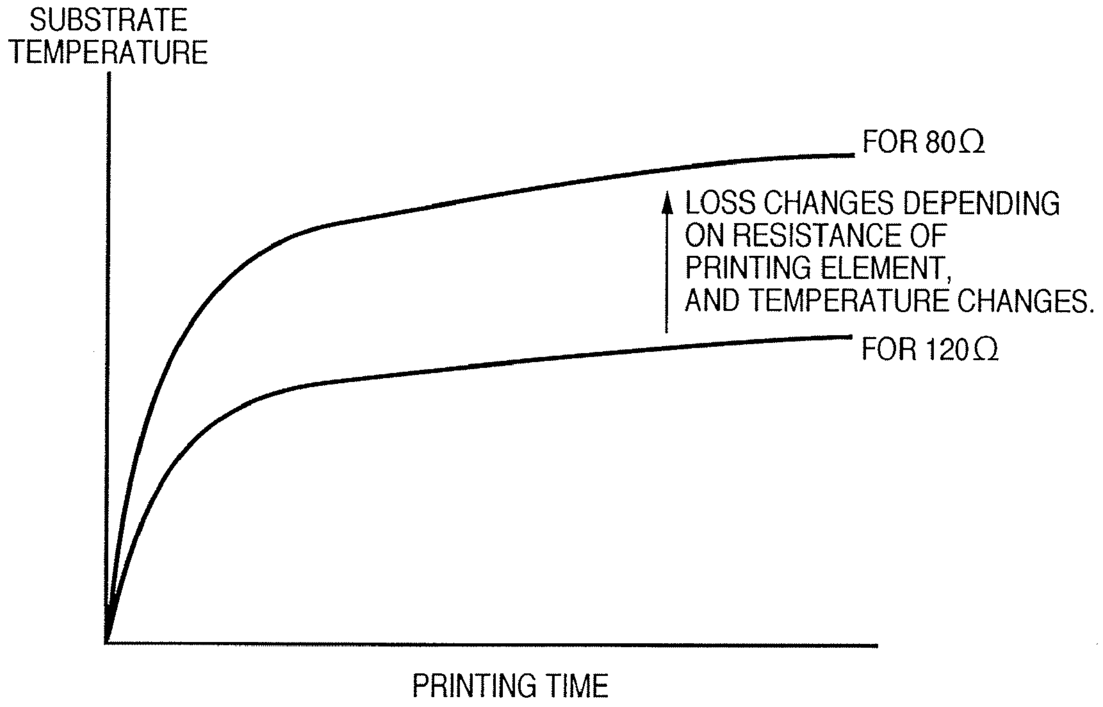
FIG. 31 is a graph showing the relationship between the printing time and the substrate temperature when a constant current is supplied to the inkjet printhead substrate.
Figure 32:
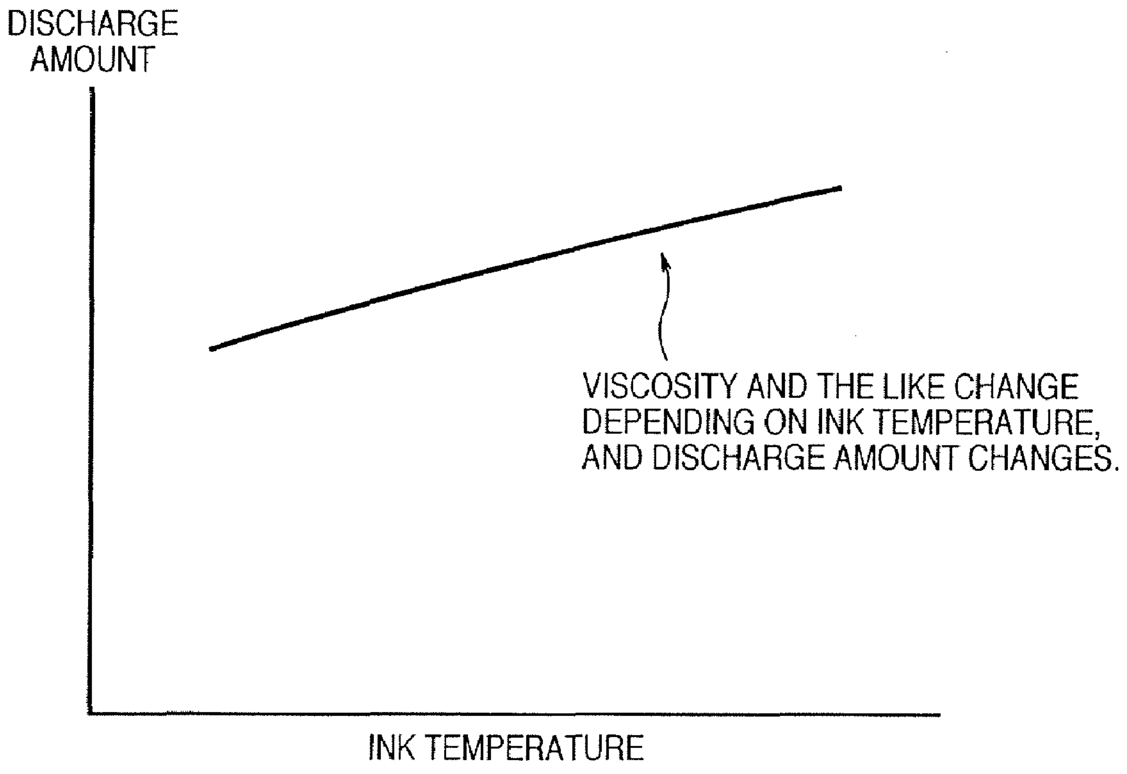
FIG. 32 is a graph showing the relationship between the ink temperature and the ink discharge amount.

In FIG. 11, RH represents the resistance value of one of simultaneously driven heating resistance elements. Along with the common wiring design, the individual wiring resistance components RL1 and RL2 which exist in the conventional configuration shown in FIG. 25 are represented as common wiring resistances RC3 (power supply side) and RC4 (GND side) in FIG. 11 for the common wiring resistances 1112 and 1113 on a substrate 1100, and the resistance values of common wiring lines following individual wiring lines in the conventional configuration that are derived from an electrical wiring tape 1300 and electrical contact substrate 2200.

In FIG. 11, VH represents a voltage which is generated upon supplying power to the heating resistance element 1103 and driving it, and is applied between the heating resistance element and the driving element. $I_{DS}$ represents a current flowing through the heating resistance element upon driving it; and $V_{DS}$, a voltage generated between the drain and source of a driving element 1107. Symbols "D", "G", and "S" represent the drain, gate, and source of the MOS transistor 1107 serving as a driving element, respectively.

With the circuit configuration as shown in FIG. 11, wiring lines which are conventionally individual ones are formed into a common wiring line. The wiring resistance which leads to a relatively large resistance loss can be suppressed to a resistance value of ⅓ to ¼ even at a portion farthest from the electrode pad, and the wiring resistance loss can be greatly reduced. However, since the resistance values RC3 and RC4 become much larger than the conventional common wiring resistance values RC1 and RC2, VH variations by the difference in the number of simultaneously driven heating resistance elements are much larger than the conventional ones. Stable printing cannot be achieved because variations in energy applied to the heating resistance element in accordance with the number of simultaneously driven heating resistance elements are still very large even by simply forming individual wiring lines into a common wiring line without changing an operation region of a MOS transistor.

Figure 12:
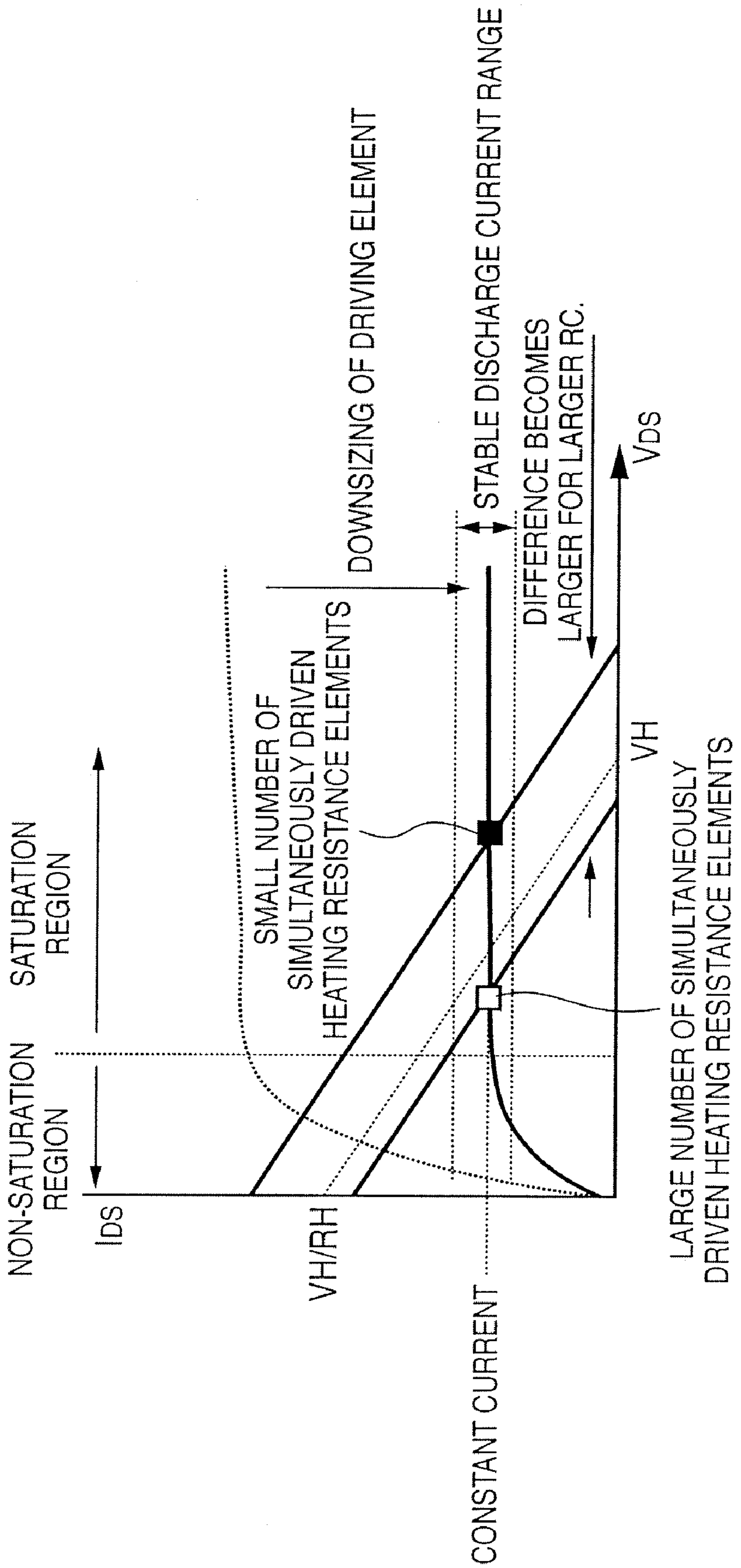
FIG. 12 is a graph showing the relationship between a change in the number of simultaneously driven heating resistance elements and variations in the drain-source current ($I_{DS}$) of a MOS transistor.

FIG. 12 is a graph showing the relationship between a change in the number of simultaneously driven heating resistance elements and variations in the drain-source current ($I_{DS}$) of the MOS transistor according to the first embodiment.

As described above, according to the prior art, the size of the driving element is determined so as to operate the driving element of the heating resistance element in the non-saturation region. According to this embodiment, the operating point is designed such that a driving element series-connected to each heating resistance element is downsized and the operating region of the driving element is shifted from the non-saturation region to the saturation region.

A configuration in which each driving element is operated in the saturation region and downsizing of the driving element with such operation will be described with reference to FIGS. 13 to 16.

Figure 13:
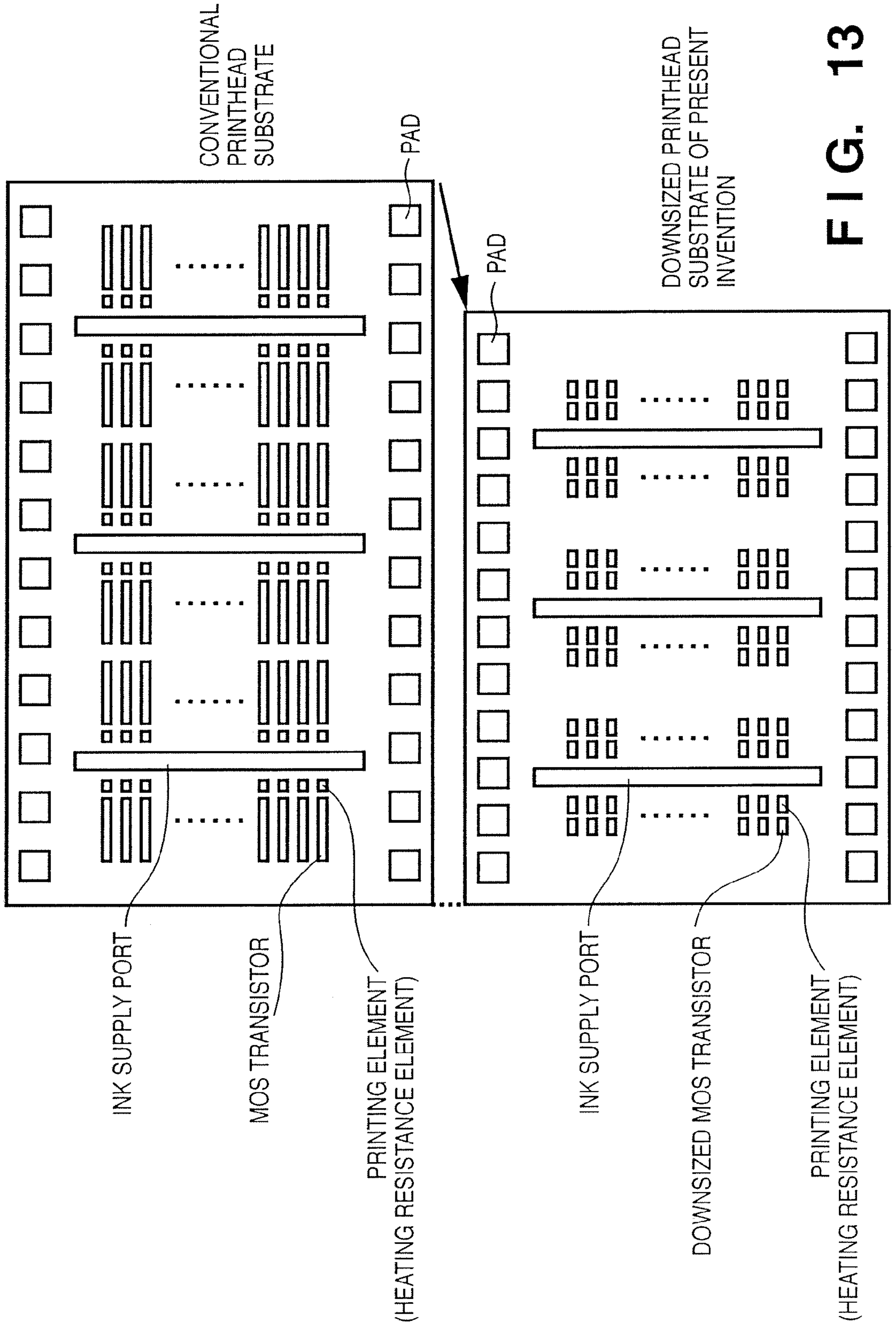
FIG. 13 is a view showing a layout on a printhead substrate (element substrate) mounted on a printhead according to a first embodiment of the present invention.

FIG. 13 is a view showing a layout on a printhead substrate (element substrate) mounted on a printhead according to the first embodiment.

FIG. 13 also illustrates an element substrate of a conventional size.

FIG. 13 shows only an extracted part associated with ink supply ports for supplying ink, printing elements formed from resistance elements, pads for externally supplying a signal and power to the element substrate, and MOS transistors which are series-connected to the printing elements and individually drive and control them.

Note that a plurality of resistance elements are connected to a common power supply line. Heating resistance elements, power supply lines, MOS transistors, and a logic circuit which supplies signals to the MOS transistors on the basis of printing data are built in the element substrate.

The first embodiment employs a printing element which is a heater of 24 μm wide and 28 μm long. This heater has a resistance value of about 400Ω. A power supply voltage applied from the printing apparatus main body to the printing element of the printhead is 24 V. In addition to them, a wiring resistance and the like exist. When the ON resistance of the MOS transistor is low, a current of about 55 to 60 mA flows through the printing element.

As is apparent from FIG. 13, the first embodiment shortens the length of the MOS transistor to about ¼, and downsizes the element substrate in comparison with the conventional one.

The reason why this embodiment can achieve about ¼ the conventional size will be explained with reference to FIG. 14.

The size of the MOS transistor which drives the printing element is determined by a gate width W. FIG. 14 shows the characteristic (V-I characteristic) of a drain-source voltage V and heater driving voltage I when the gate width W of the MOS transistor in the first embodiment is used as a parameter.

In the prior art, an element substrate for a printhead is formed at the gate width W=560 μm. As is apparent from FIG. 14, for W=560 μm, the MOS transistor is operated in the non-saturation region at a current of 55 to 60 mA, and thus used as a switch operable in a region where the ON resistance does not greatly change. If the power supply voltage or the like changes in operation in the non-saturation region, the ON resistance is low and constant, and thus the current value readily changes, that is, energy applied to the printing element readily varies, failing to obtain stable printing and a long service life.

In the configuration disclosed in U.S. Pat. No. 6,523,922, a relatively constant energy is supplied to the printing element because the MOS transistor is so controlled as to keep the voltage between both ends of the printing element constant even upon variations in, e.g., power supply voltage.

However, when the printing element is formed from a resistance material having a negative temperature coefficient, if a voltage between both ends of the printing element is constant, the current increases along with temperature rise. As a result, energy increases.

According to this embodiment, even when such printing element having a negative temperature coefficient is used, the energy load on the printing element can be reduced to prolong the service life by making a current value flowing through the printing element constant.

Figure 14:
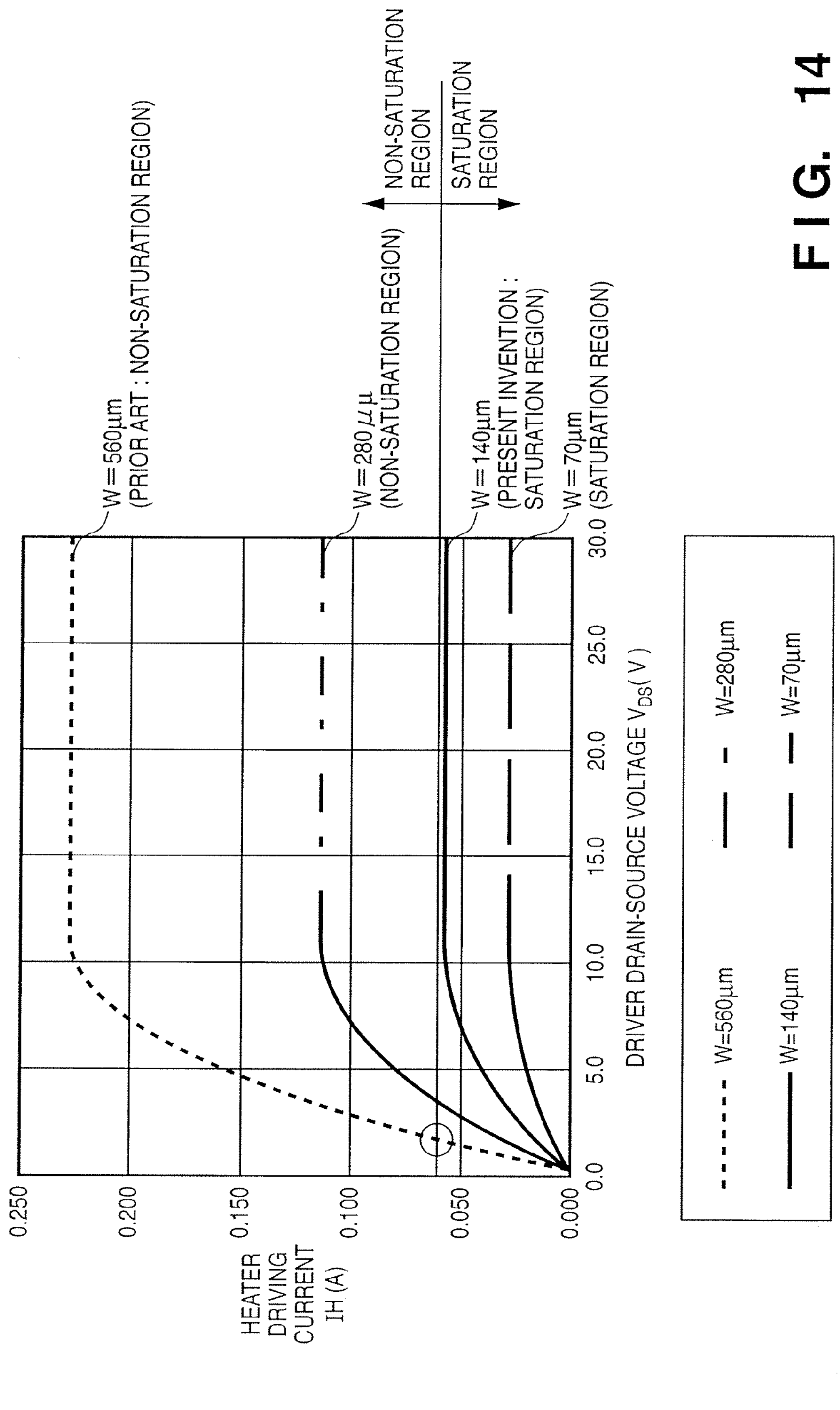
FIG. 14 is a graph showing the characteristic (V-I characteristic) between a drain-source voltage V and heater driving voltage I when a gate width W of a MOS transistor is used as a parameter.

As shown in FIG. 14, the gate width W of the MOS transistor which enters the saturation region at about 55 to 60 mA is about 140 μm.

Figure 15:
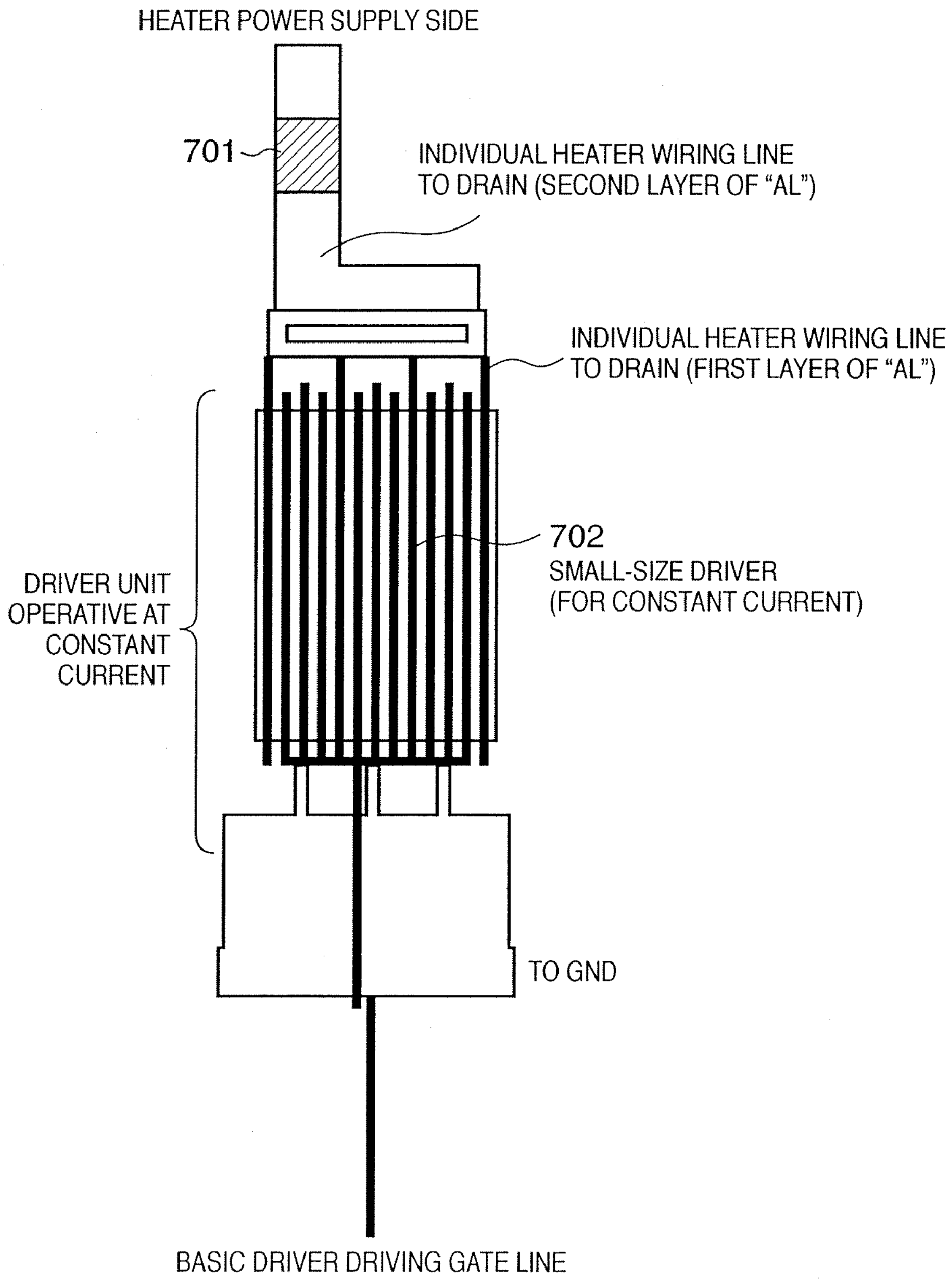
FIG. 15 is a view showing a printing element and the periphery of a MOS transistor.

FIG. 15 is a view showing the printing element and the periphery of the MOS transistor.

The chip can be downsized by shortening the gate width. Hence, according to the present invention, the MOS transistor for controlling driving of the printing element can be operated in the saturation region by decreasing the gate width from the conventional width of 560 μm to about a ¼ width of 140 μm. A current flowing through the printing element can be made constant, and at the same time the driver can be downsized.

In FIG. 15, reference numeral 701 denotes a printing element; and 702, a driver which supplies a constant current to the printing element (heater) 701 and is greatly downsized from a conventional one.

Figure 16:
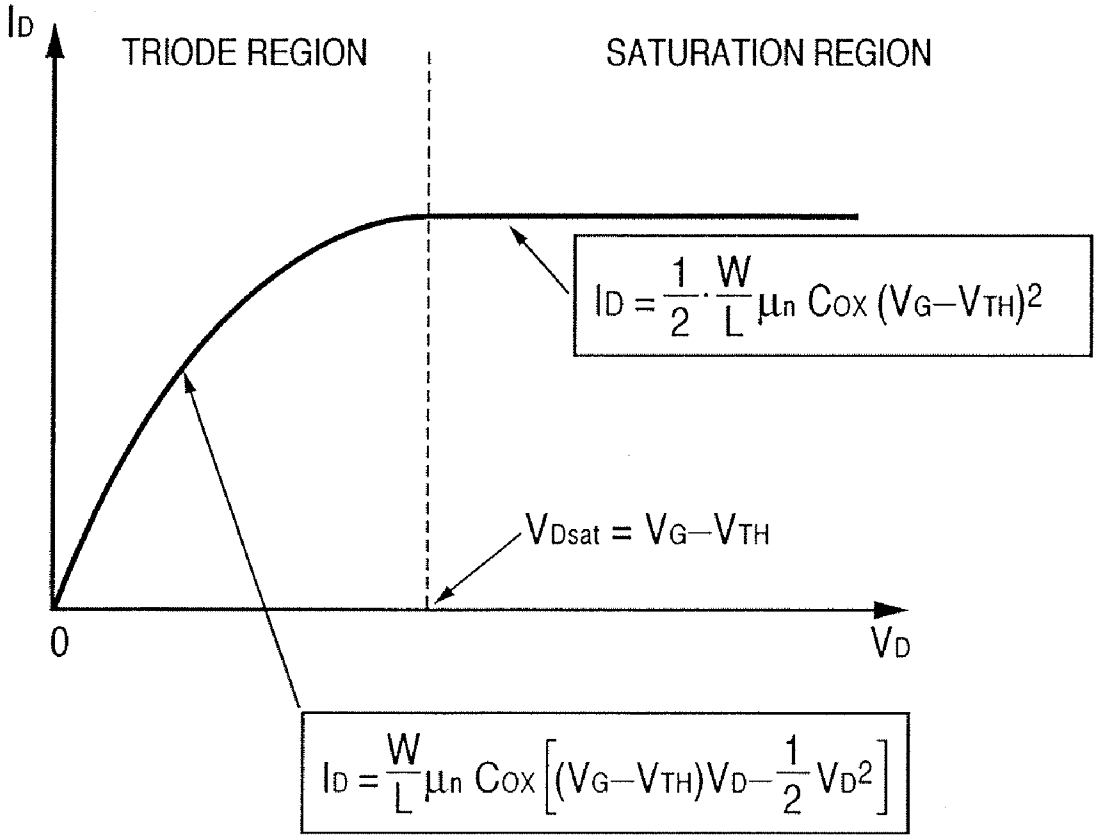
FIG. 16 is a graph showing the general characteristic of a MOS transistor.

FIG. 16 is a graph showing the general characteristic of a MOS transistor.

In FIG. 16, the MOS transistor can be operated in the saturation region by sufficiently shortening the gate width. As is apparent from this characteristic, a constant current can be maintained regardless of the gate voltage. In FIG. 16, $I_D$ represents the drain current; W, the channel length of the MOS-FET; L, the channel width of the MOS-FET; $\mu_n$, the carrier mobility in the channel; $C_{OX}$, the capacitance of the gate oxide film; $V_G$, the gate voltage; $V_{TH}$, the threshold voltage; and $V_D$, the drain voltage.

With this setting, when the number of simultaneously driven heating resistance elements changes, as shown in FIG. 12, the drain-source voltage $V_{DS}$ of the driving element greatly varies between a case ■ shown in FIG. 12 in which the number of simultaneously driven heating resistance elements is small and a case □ shown in FIG. 12 in which the number of simultaneously driven heating resistance elements is large. However, this variation range exists in the saturation region of the driving element, and thus a constant current flows through the heating resistance element regardless of variations in $V_{DS}$, i.e., a change in the number of simultaneously driven heating resistance elements.

In this case, $I_{DS}$ is constant, $I_{DS}^2 \times R$ (resistance value of the heating resistance element) is also constant, and a constant energy is applied to the heating resistance element.

According to the above-described embodiment, the driving element is downsized and operated in the saturation region. Even if the number of simultaneously driven heating resistance elements increases, a constant energy can still be applied to the heating resistance element. An increase in wiring region can be suppressed by forming conventional individual wiring lines into a common wiring line. The chip size does not increase, and as a result, the rise of the production cost can be suppressed.

The above-described embodiment can therefore achieve stable ink discharge and provide a high-image-quality, long-service-life printhead.

Second Embodiment

Figure 17:
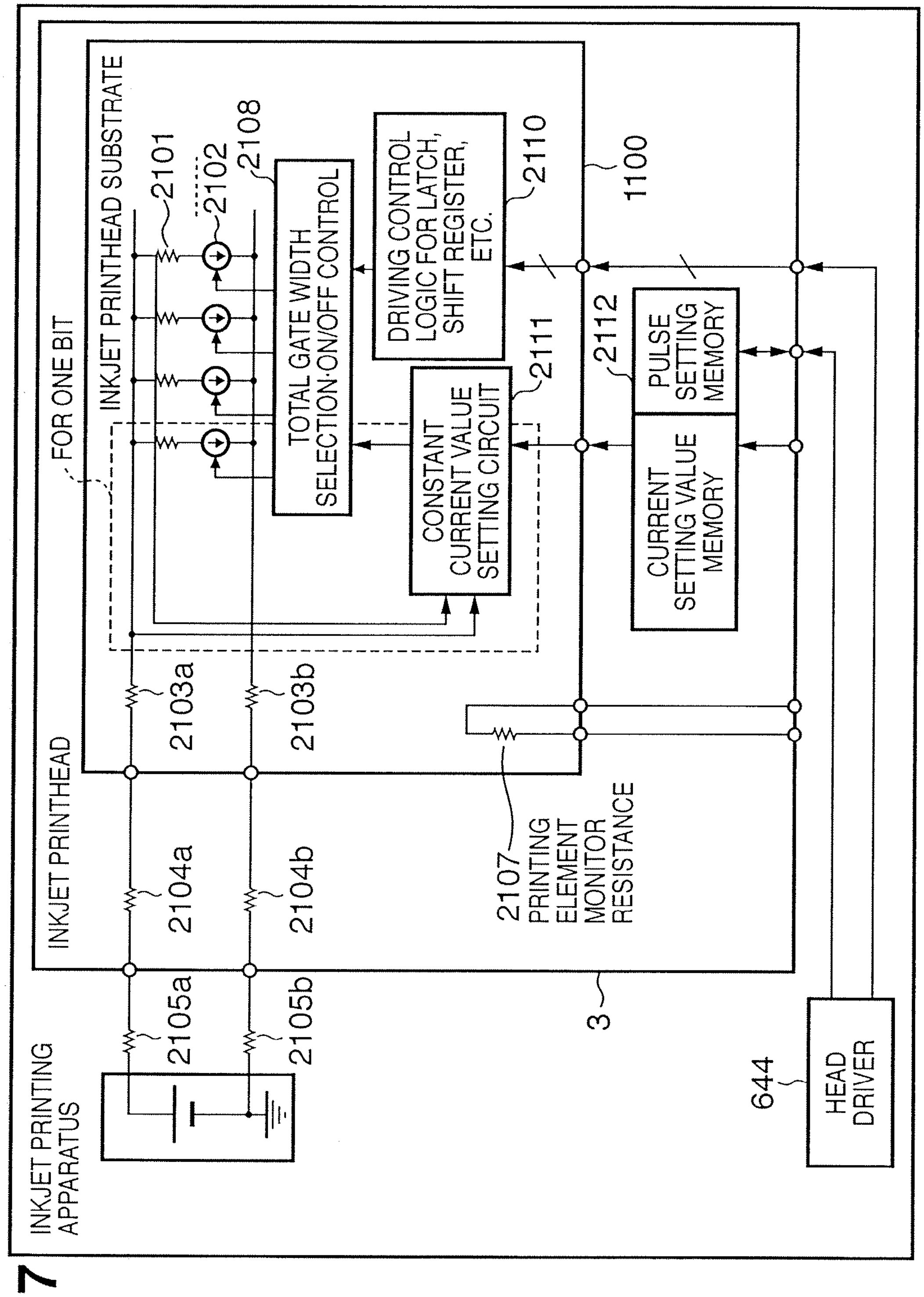
FIG. 17 is a block diagram showing the configurations of an inkjet printhead substrate, a printhead integrating the substrate, and a part which influences energy applied to a printing element in a printing apparatus using the printhead.

FIG. 17 is a block diagram showing the configurations of an inkjet printhead substrate (to be referred to as a substrate hereinafter) 1100 according to the second embodiment of the present invention, a printhead 3 integrating the substrate, and a part, of a printing apparatus using the printhead, which influences energy applied to a printing element.

The apparatus main body comprises a power supply which supplies power to the printhead and printing element substrate, and the power supply supplies a predetermined voltage and current to the element substrate.

A description of a part which is identical to that of a conventional substrate described with reference to FIGS. 27 to 32 will be omitted, and only a characteristic part of the second embodiment to which the present invention is applied will be described.

In FIG. 17, reference numeral 2101 denotes each printing element (heating resistance element); and 2102, each printing element switching element (driver) for supplying a constant current to the printing element. The switching elements have gates with a plurality of divided gate widths capable of selectively operating the printing elements. Reference numerals 2103*a* and 2103*b* denote parasitic resistances which are generated in common wiring lines within the substrate 1100; 2104*a* and 2104*b*, parasitic resistances which are generated in common wiring lines within the printhead 3; 2105*a* and 2105*b*, parasitic resistances which are generated in common wiring lines in the printing apparatus; and 2107, a monitor resistance which is formed in the same step as formation of the printing element in order to reflect the representative resistance value of the printing element 2101 of the substrate 1100.

Reference numeral 2108 denotes a controller which ON/OFF-controls the driver 2102 on the basis of image data for printing that is sent from a head driver 644 of the printing apparatus via a shift register, latch, and the like and a driving pulse signal for supplying ink discharge energy to the printing element, and performs a process such as total gate width selection in order to perform control of supplying a constant current to the printing element regardless of the voltage drop generated in the parasitic resistance upon a change in the number of simultaneously driven printing elements on the basis of the resistance value of the monitor resistance 2107. Reference numeral 2110 denotes a driving control logic unit which controls the pulse width of a driving pulse for driving the printing element.

Reference numeral 2112 denotes a head memory serving as a nonvolatile memory (e.g., EEPROM, FeRAM, or MRAM) which stores, for each printing element, setting information on a constant current value determined by reflecting the resistance value of the monitor resistance 2107. In the second embodiment, a voltage generated at both ends of the printing element 2101 is optimized on the basis of information stored in the head memory 2112, and the energy loss of the driver 2102 can be minimized regardless of variations between printing elements in the manufacture or the like.

Reference numeral 2111 denotes a setting circuit which sets a constant current on the basis of information read out from the head memory 2112.

Figure 18:
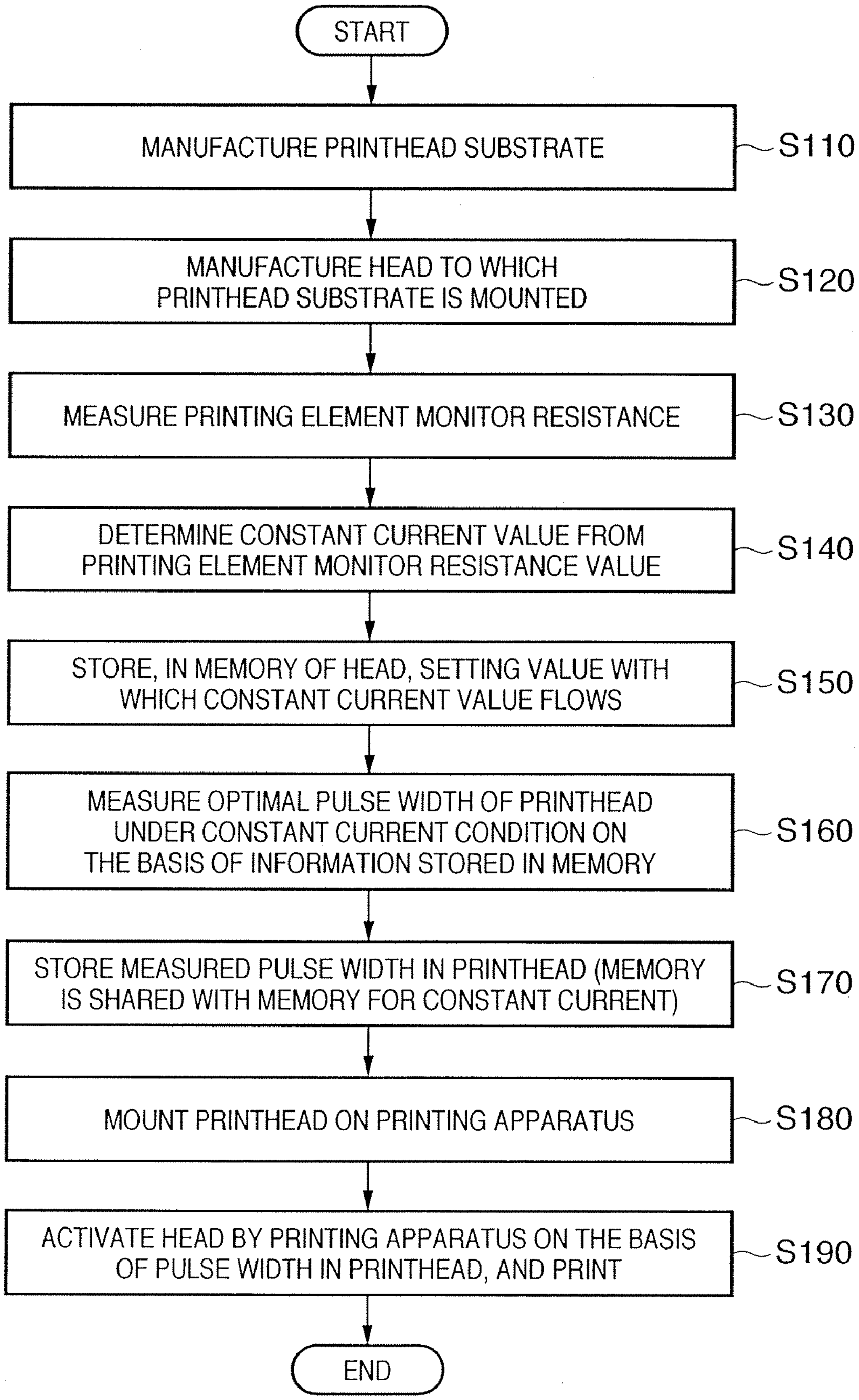
FIG. 18 is a flowchart showing a process of manufacturing a substrate, manufacturing a head, mounting the printhead on a printing apparatus, and printing.

FIG. 18 is a flowchart showing a process of manufacturing a substrate, manufacturing a head, mounting the printhead on a printing apparatus, and printing according to the second embodiment.

In step S110, a substrate 1100 is manufactured by a semiconductor manufacturing process. The manufacturing process is basically the same as a conventional one. In the second embodiment, printing elements 2101, drivers 2102, a monitor resistance 2107, a controller 2108, and a setting circuit 2111 which sets for each printing element a constant current value determined in accordance with the resistance value are built in the manufactured substrate 1100.

In step S120 after manufacturing the substrate, the substrate, other components, and the like are assembled into a printhead 3. The printhead 3 comprises a head memory 2112 which stores information for setting a constant current value for each printing element and determining the driving time of the printing element. In order to determine a constant current value, the resistance value of the monitor resistance 2107 is read in step S130 after assembling the printhead 3. In step S140, an optimal current value to be supplied to printing elements with manufacturing variations is determined on the basis of the resistance value.

Setting of a current value when the resistance value of the printing element varies will be explained.

FIG. 19 is a table showing setting of a current value when the resistance value of the printing element varies according to the second embodiment.

The second embodiment assumes the same conditions as those described in the prior art, that is, a case in which the resistance value of the printing element is about 100Ω and varies by +20% owing to manufacturing variations. The constant current value is so set as to generate at both ends of the printing element a voltage (in this case 15 V) obtained by subtracting the maximum variation value (in this case 4.5 V) of a driver voltage for controlling a constant current from the power supply voltage.

For example, when the resistance value of the printing element is 80Ω, a current which provides a voltage of 15 V at both ends of the printing element is 188 mA. In order to provide the information to the substrate 1100 so as to set the current value to 188 mA, the information is written in the head memory 2112. For a substrate having another resistance value, information may be written in the head memory 2112 so as to set a proper current in accordance with the table shown in FIG. 19.

In this manner, step S150 is performed.

Step S160 of supplying a constant current on the basis of the information set in the head memory 2112 will be explained with reference to FIG. 20.

Figure 20:
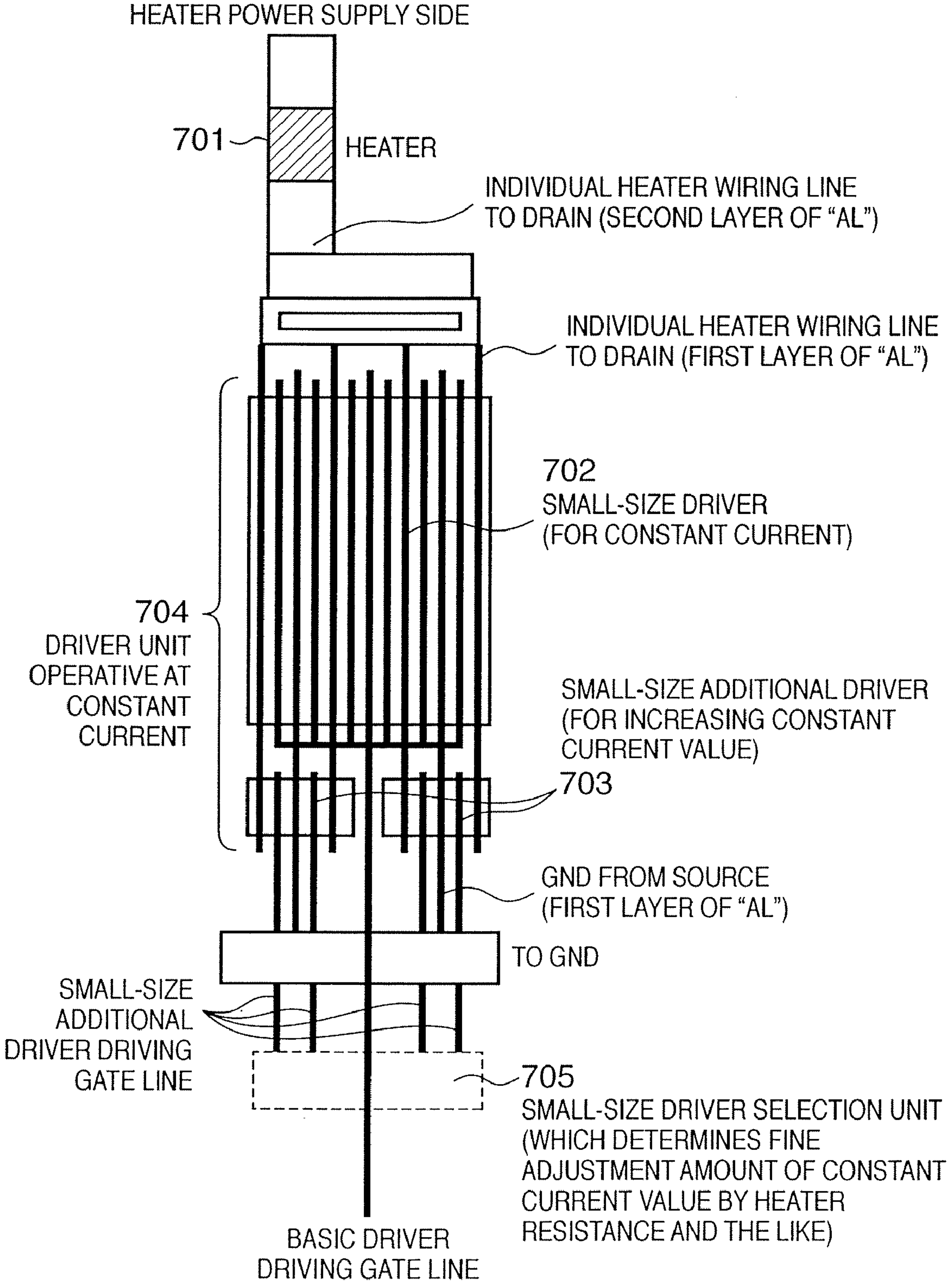
FIG. 20 is a view showing a configuration in which a printing element 701 and a block for driving the printing element are extracted for one bit.

FIG. 20 is a view showing a configuration in which the printing element 701 and a block for driving the printing element are extracted for one bit.

In FIG. 20, reference numeral 701 denotes a printing element; 702, a driver which supplies a constant current to the printing element (heater) 701 and is downsized greatly from a conventional driver; 703, an additional driver which is much smaller than the driver 702; and 704, a driver unit which is an assembly of these drivers and operates at a constant current. In the second embodiment, a constant current value is finely adjustable by whether to drive the additional driver 703 when driving the printing element 701. Since the drivers 702 and 703 are formed from MOS transistors and so downsized as to operate in the saturation region, a constant current can be maintained for each printing element.

In the configuration shown in FIG. 20, four additional drivers are arranged for each printing element. Letting $\Delta x$ and $\Delta y$ be current increase amounts by the respective additional drivers, the current value can be finely adjusted in multiple steps by selectively driving one or both of the additional drivers by a small-size driver selection unit 705. Also, the energy loss of the constant current can also be made constant and small regardless of the resistance value of the printing element.

Needless to say, even if voltage drops generated commonly to printing elements owing to the parasitic resistances 2103*a*, 2103*b*, 2104*a*, 2104*b*, 2105*a*, 2105*b*, and the like shown in FIG. 17 become different upon a change in the number of simultaneously driven printing elements, energy does not vary because the configuration of the second embodiment makes a current flowing through each printing element constant. The voltage control range by the driver 702 suffices to be set in consideration of the difference between possible voltage drops in common wiring lines.

With the above-described configuration, even when the resistance value of the printing element varies within a range of 80 to 120Ω, a constant current is determined and set in accordance with the resistance value of the printing element, as shown in FIG. 19. This can eliminate a large power loss (58%) on the low-resistance value, which was a problem in the prior art, and the power loss (energy loss) can be made constant in the entire range where the resistance varies.

Figure 21A:
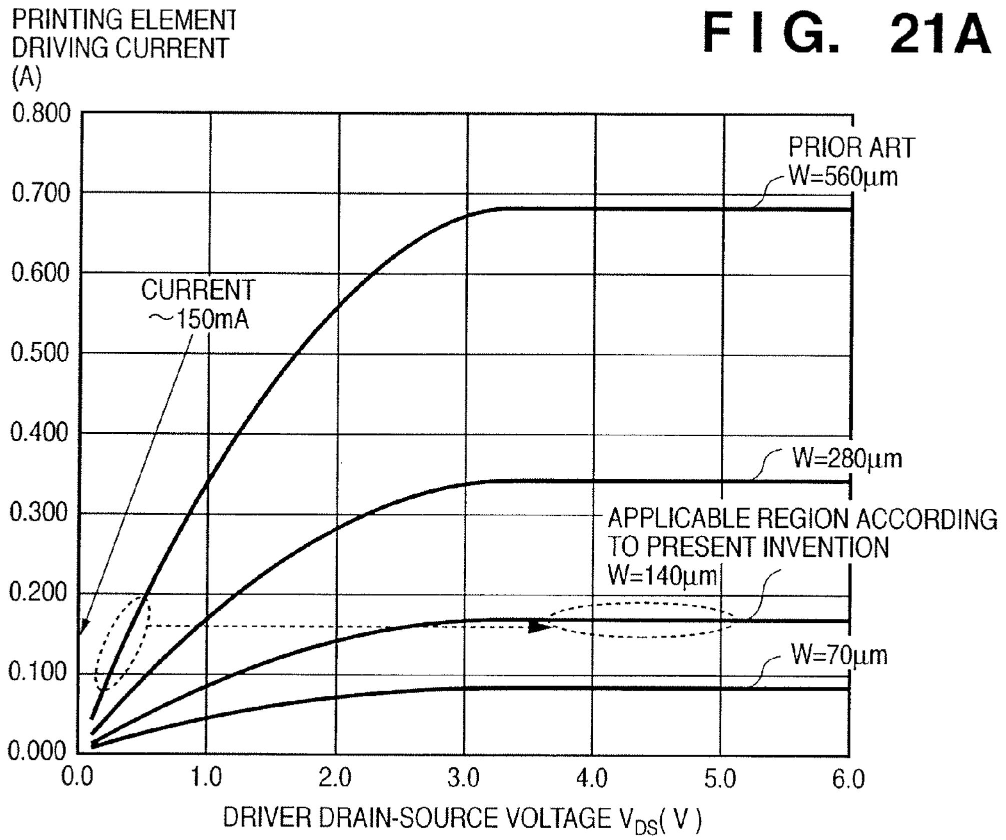
FIGS. 21A and 21B are graphs showing the current-voltage characteristics of MOS transistors (drivers) used in a second embodiment of the present invention.
Figure 21B:
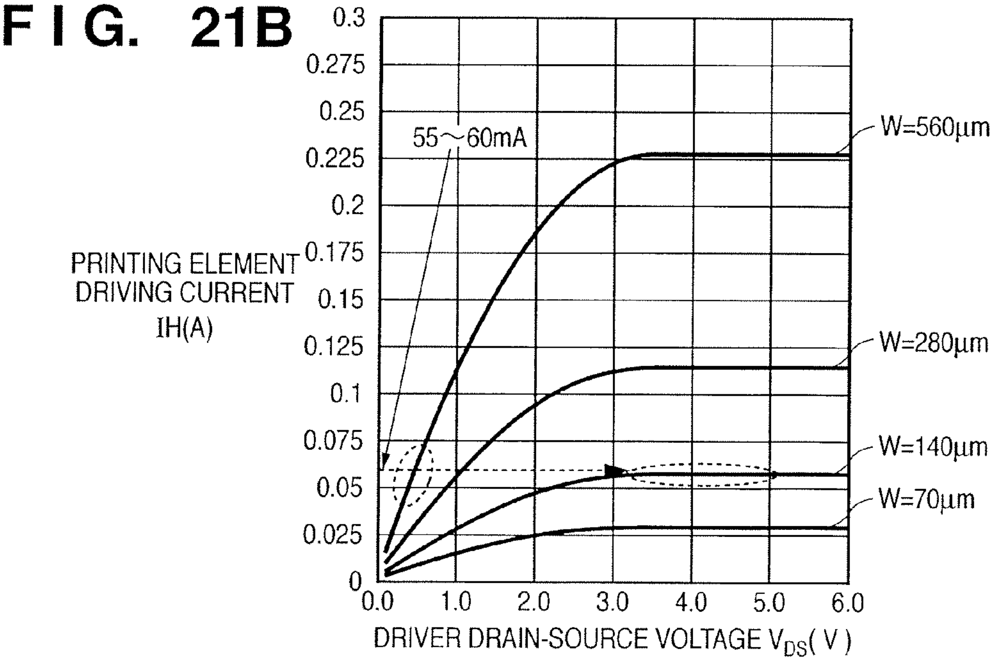

FIGS. 21A and 21B show the current-voltage characteristic of the MOS transistor (driver) used in the second embodiment. The performance may be expressed by various indices such as the gate length and gate width. The second embodiment describes the gate width W as a parameter since a constant current value is changeable in accordance with the number of small-size drivers.

In FIGS. 21A and 21B, the gate width of 560 μm conventionally used as an ON resistance is decreased to 70 μm.

Since the center of the current value is 150 mA, as shown in FIG. 19, a current flowing through the printing element can be kept constant by the saturation current by setting a gate width of about 140 μm as the center value, as shown in FIGS. 21A and 21B.

Figure 22:
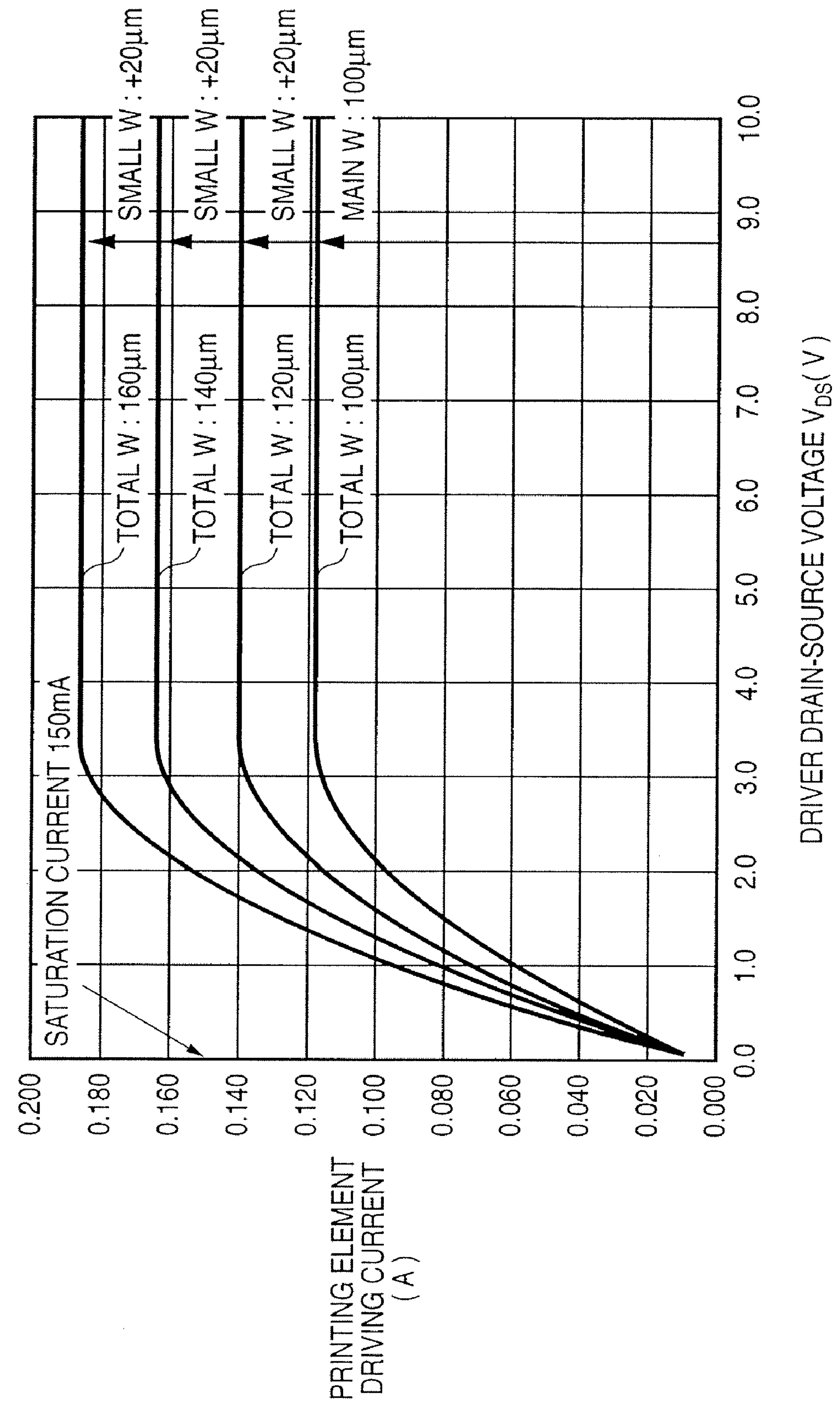
FIG. 22 is a graph showing how a constant current value changes when a main gate width of 100 μm and a small driver size of 20 μm at three points are set.

FIG. 22 is a graph showing how a constant current value changes when a main gate width of 100 μm and a small driver size of 20 μm at three points are set.

As is apparent from FIG. 22, a current flowing through the printing element can be kept constant by the saturation current even when the constant current value is changed at a step of about 20 mA. FIG. 22 shows changes at three points centered on the gate width (W) of 140 μm. The constant current value can be set in smaller steps by more finely increasing the number of gate widths.

The width of a signal pulse for energizing each printing element in order to supply an almost constant energy to ink is so determined as to stably discharge ink with a printhead having a current value set as described above. In practice, the pulse width is gradually increased from a given value to set a pulse width at which ink discharge stabilizes.

Step S160 is performed in the above fashion.

FIG. 19 shows an example of pulse widths which supply almost the same energy.

In FIG. 19, when energy applied to one printing element is 2.25 μJ, a pulse width of 0.8 μS to 1.2 μS is preferable in accordance with the resistance of the printing element. As is apparent from the energy loss value shown in FIG. 19, the energy loss exhibits a difference of 10 times due to variations in the resistance value of the printing element in the prior art, whereas the energy loss is kept constant even upon variations in the resistance value of the printing element and the loss value is kept minimum (about 6.7% in an example of FIG. 19) in the second embodiment.

In step S170, the determined pulse width is stored as pulse width information in the head memory 2112 of the printhead 3.

In step S180, the manufactured/set printhead 3 is mounted on a printing apparatus. In step S190, the printing apparatus prints by supplying a printing signal from the head driver 644 to the printhead 3 and substrate 1100 on the basis of the pulse width information stored in the head memory 2112 and image information to be printed.

According to the above-described embodiment, an optimal current value for driving the printing element is determined for each printhead on the basis of the value of the monitor resistance attached to the printhead. Variations in energy loss upon variations in the resistance value of the printing element can be suppressed constant, and the loss value can be minimized.

As a result, stable, high-quality printing and a long-service-life printhead can be achieved.

Note that in the foregoing embodiments, although the description has been provided based on an assumption that a droplet discharged by the printhead is ink and that the liquid contained in the ink tank is ink, the contents are not limited to ink. For instance, the ink tank may contain processed liquid or the like, which is discharged to a printing medium in order to improve the fixability or water repellency of the printed image or to improve the image quality.

Further note that each of the above-described embodiments comprises means (e.g., an electrothermal transducer or the like) for generating heat energy as energy utilized upon execution of ink discharge, and adopts the method which causes a change in state of ink by the heat energy, among the ink-jet printing method. According to this printing method, a high-density, high-precision printing operation can be attained.

As the typical arrangement and principle of the ink-jet printing system, one practiced by use of the basic principle disclosed in, for example, U.S. Pat. Nos. 4,723,129 and 4,740,796 is preferable. The above system is applicable to either one of so-called an on-demand type and a continuous type. Particularly, in the case of the on-demand type, the system is effective because, by applying at least one driving signal, which corresponds to printing information and gives a rapid temperature rise exceeding nucleate boiling, to each of electrothermal transducers arranged in correspondence with a sheet or liquid channels holding a liquid (ink), heat energy is generated by the electrothermal transducer to effect film boiling on the heat acting surface of the printhead, and consequently, a bubble can be formed in the liquid (ink) in one-to-one correspondence with the driving signal. By discharging the liquid (ink) through a discharge opening by growth and shrinkage of the bubble, at least one droplet is formed. If the driving signal is applied as a pulse signal, the growth and shrinkage of the bubble can be attained instantly and adequately to achieve discharge of the liquid (ink) with the particularly high response characteristics.

As the pulse driving signal, signals disclosed in U.S. Pat. Nos. 4,463,359 and 4,345,262 are suitable. Note that further excellent printing can be performed by using the conditions described in U.S. Pat. No. 4,313,124 of the invention which relates to the temperature rise rate of the heat acting surface.

As an arrangement of the printhead, in addition to the arrangement as a combination of discharge nozzles, liquid channels, and electrothermal transducers (linear liquid channels or right angle liquid channels) as disclosed in the above specifications, the arrangement using U.S. Pat. Nos. 4,558,333 and 4,459,600, which disclose the arrangement having a heat acting portion arranged in a flexed region is also included in the present invention.

Furthermore, although each of the above-described embodiments adopts a serial-type printer which performs printing by scanning a printhead, a full-line type printer employing a printhead having a length corresponding to the width of a maximum printing medium may be adopted. For a full-line type printhead, either the arrangement which satisfies the full-line length by combining a plurality of printheads as described above or the arrangement as a single printhead obtained by forming printheads integrally can be used.

In addition, not only a cartridge type printhead in which an ink tank is integrally arranged on the printhead itself but also an exchangeable chip type printhead, as described in the above embodiment, which can be electrically connected to the apparatus main unit and can receive an ink from the apparatus main unit upon being mounted on the apparatus main unit can be applicable to the present invention.

It is preferable to add recovery means for the printhead, preliminary auxiliary means, and the like provided as an arrangement of the printer of the present invention since the printing operation can be further stabilized. Examples of such means include, for the printhead, capping means, cleaning means, pressurization or suction means, and preliminary heating means using electrothermal transducers, another heating element, or a combination thereof. It is also effective for stable printing to provide a preliminary discharge mode which performs discharge independently of printing.

Furthermore, as a printing mode of the printer, not only a printing mode using only a primary color such as black or the like, but also at least one of a multi-color mode using a plurality of different colors or a full-color mode achieved by color mixing can be implemented in the printer either by using an integrated printhead or by combining a plurality of printheads.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application Nos. 2003-377262 and 2003-377258 filed on Nov. 6, 2003, the entire contents of which are incorporated herein by reference.

What is claimed is:

1. A printhead substrate having a plurality of printing elements, and driving elements, which are arranged in correspondence with the plurality of printing elements, switch and control driving of corresponding printing elements, and are formed from MOS transistors, comprising:

a common wiring line which commonly supplies power, and to which a plurality of simultaneously drivable printing elements out of the plurality of printing elements are connected;

a first pad which supplies power to said common wiring line;

a logic circuit which controls the plurality of driving elements;

a GND wiring line which corresponds to said common wiring line and is shared over a plurality of blocks; and a second pad which connects to said GND wiring line, wherein each of the driving elements is an element for supplying a constant current to the corresponding printing element, and the plurality of printing elements are connected to said common wiring line such that resistance values from each of the plurality of printing elements to said common wiring line are substantially equal to each other.

2. The printhead substrate according to claim 1, wherein the plurality of printing elements are electrothermal transducers; and one terminal of each of the electrothermal transducers is connected to said common wiring line, and the other terminal is connected to a drain of the MOS transistor.

3. The printhead substrate according to claim 2, wherein the MOS transistor operates in a saturation region of a drain source current.

4. The printhead substrate according to claim 1, wherein each printing element is substantially equivalently connected to said common wiring line.

5. The printhead substrate according to claim 1, wherein said common wiring line is connected to the printing elements as a single wiring line without branch out.

6. The printhead substrate according to claim 1, wherein said common wiring line is strip-like.

7. A printhead using the printhead substrate according to claim 1.

8. A printing apparatus which prints by using the printhead according to claim 7.

9. A printhead substrate having a plurality of printing elements, and driving elements, which are arranged in correspondence with the plurality of printing elements, switch and control driving corresponding printing elements, and are formed from MOS transistors, comprising:

a common wiring line which commonly supplies power, and to which a plurality of simultaneously drivable printing elements out of the plurality of printing elements are connected;

a first pad which supplies power to said common wiring line;

a setting circuit which sets a gate width of a MOS transistor for energizing one of the printing elements; and a driving circuit which drives the MOS transistor having the gate width set by said setting circuit, wherein each of the driving elements is an element for supplying a constant current to the corresponding printing element, and the plurality of printing elements are connected to said common wiring line such that resistance values from each of the plurality of printing elements to said common wiring line are substantially equal to each other.

10. The printhead substrate according to claim 9, further comprising a resistance having a value representative of resistance values of the printing elements, wherein said setting circuit sets the gate width on the basis of the resistance value of said resistance.

11. The printhead substrate according to claim 9, wherein the MOS transistor is formed from a plurality of small MOS transistors which are connected to the printing element and have different gate widths, and said setting circuit sets the gate width by setting the driving number of the small MOS transistors.

12. The printhead substrate according to claim 11, wherein the driving number of the small MOS transistors is set by a sum of a current value based on the representative resistance value and saturation currents of the small MOS transistors.

13. A printhead using the printhead substrate according to claim 9.

14. A printing apparatus which prints by using the printhead according to claim 13.

* * * * *